(12) United States Patent
Farooq et al.

(10) Patent No.: US 8,841,777 B2
(45) Date of Patent: Sep. 23, 2014

(54) BONDED STRUCTURE EMPLOYING METAL SEMICONDUCTOR ALLOY BONDING

(75) Inventors: Mukta G. Farooq, Hopewell Junction, NY (US); Zhengwen Li, Hopewell Junction, NY (US); Zhijiong Luo, District Beijing (CN); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 801 days.

(21) Appl. No.: 12/685,954

(22) Filed: Jan. 12, 2010

(65) Prior Publication Data

US 2011/0168434 A1     Jul. 14, 2011

(51) Int. Cl.
H01L 21/48 (2006.01)
H01L 21/52 (2006.01)
H01L 21/40 (2006.01)
H01L 21/20 (2006.01)
H01L 27/06 (2006.01)
H01L 21/768 (2006.01)

(52) U.S. Cl.
CPC ...... H01L 21/76841 (2013.01); H01L 21/2007 (2013.01); H01L 27/0688 (2013.01)
USPC .......................................... 257/777; 257/778

(58) Field of Classification Search
None
See application file for complete search history.

(56) References Cited

U.S. PATENT DOCUMENTS

| | | | |
|---|---|---|---|
| 4,939,568 A * | 7/1990 | Kato et al. ................. | 257/686 |
| 5,098,861 A | 3/1992 | Blackstone | |
| 5,102,821 A | 4/1992 | Moslehi | |
| 5,236,118 A | 8/1993 | Bower et al. | |
| 5,272,104 A | 12/1993 | Schrantz et al. | |
| 5,563,084 A * | 10/1996 | Ramm et al. ................ | 438/15 |
| 5,569,620 A | 10/1996 | Linn et al. | |
| 5,654,226 A | 8/1997 | Temple et al. | |
| 6,355,501 B1 * | 3/2002 | Fung et al. .................. | 438/107 |
| 6,600,173 B2 * | 7/2003 | Tiwari ........................ | 257/74 |
| 6,764,923 B2 | 7/2004 | Dietrich et al. | |
| 6,841,453 B2 | 1/2005 | Mastromatteo | |
| 6,841,883 B1 * | 1/2005 | Farnworth et al. .......... | 257/777 |
| 6,962,835 B2 * | 11/2005 | Tong et al. .................. | 438/108 |
| 7,052,941 B2 * | 5/2006 | Lee ........................... | 438/152 |
| 7,208,392 B1 | 4/2007 | Jaussaud et al. | |
| 7,358,578 B2 * | 4/2008 | Iwasaki et al. .............. | 257/411 |

(Continued)

OTHER PUBLICATIONS

Xiao, Z.X. et al., "Low Temperature Silicon Wafer-to-Wafer Bonding with Nickel Silicide" Journal of the Electrochemical Society (1998) pp. 1360-1362, vol. 145(4).

(Continued)

*Primary Examiner* — Jarrett Stark
(74) *Attorney, Agent, or Firm* — Scully, Scott, Murphy & Presser, P.C.; Catherine Ivers

(57) ABSTRACT

Vertical stacks of a metal portion and a semiconductor portion formed on a first substrate are brought into physical contact with vertical stacks of a metal portion and a semiconductor portion formed on a second substrate. Alternately, vertical stacks of a metal portion and a semiconductor portion formed on a first substrate are brought into physical contact with metal portions formed on a second substrate. The assembly of the first and second substrates is subjected to an anneal at a temperature that induces formation of a metal semiconductor alloy derived from the semiconductor portions and the metal portions. The first substrate and the second substrate are bonded through metal semiconductor alloy portions that adhere to the first and second substrates.

16 Claims, 19 Drawing Sheets

(56) References Cited

U.S. PATENT DOCUMENTS

| | | | |
|---|---|---|---|
| 8,148,728 B2* | 4/2012 | Or-Bach et al. | 257/67 |
| 2003/0148590 A1* | 8/2003 | Kellar et al. | 438/455 |
| 2003/0157748 A1* | 8/2003 | Kim et al. | 438/107 |
| 2004/0014308 A1* | 1/2004 | Kellar et al. | 438/612 |
| 2005/0046038 A1* | 3/2005 | Farnworth et al. | 257/777 |
| 2005/0156320 A1 | 7/2005 | Mastromatteo | |
| 2005/0224921 A1* | 10/2005 | Gupta et al. | 257/621 |
| 2006/0121690 A1* | 6/2006 | Pogge et al. | 438/455 |
| 2007/0057384 A1* | 3/2007 | Alam et al. | 257/783 |
| 2007/0087528 A1* | 4/2007 | Kim et al. | 438/455 |
| 2007/0120241 A1* | 5/2007 | Trezza et al. | 257/686 |
| 2007/0158787 A1* | 7/2007 | Chanchani | 257/619 |
| 2008/0163139 A1* | 7/2008 | Scheffer et al. | 716/4 |
| 2011/0248396 A1* | 10/2011 | Liu et al. | 257/686 |
| 2012/0086067 A1* | 4/2012 | Sekar et al. | 257/315 |

OTHER PUBLICATIONS

Xiao, Z.X. et al., "Silicon/Glass Wafer-to-Wafer Bonding with Ti/Ni Intermediate Bonding" Sensors and Actuators A Physical (1998) pp. 123-126, vol. 71.

\* cited by examiner

BONDED STRUCTURE EMPLOYING METAL SEMICONDUCTOR ALLOY BONDING

BACKGROUND

This invention relates to a bonded structure that provides bonding between multiple substrates through formation of a metal semiconductor alloy and methods of manufacturing the same.

Bonding of multiple substrates is required to enable three-dimensional integration of chips. Bonding of two substrates can be achieved by adhesion of two dielectric materials as in an oxide-to-oxide bonding that fuses silicon dioxide materials from two substrates after bonding, by adhesion between two metallic material as in a copper-to-copper bonding that employs direct contact between opposing copper pads and a subsequent grain growth across the original interface between the opposing copper pads, or by a method employing a combination of the two adhesion mechanisms.

Through-substrate-via (TSV) structures, formed after multiple substrates are bonded and optionally thinned, provide electrical connection across the multiple substrates in a bonded structure. A TSV structure may include a conductive material such as copper, which diffuses rapidly in the plane of the bonding interface between substrates because microscopic irregularities and cavities are present at the interface. Diffusion of the conductive material from a TSV structure into the surrounding substrate region can cause electrical shorts and reliability problems in the bonded structure.

An interfacial layer, such as silicon nitride, can be employed to reduce subsequent diffusion of conductive material from TSV structures. In this case, the diffusion resistant materials retard lateral diffusion of the conductive material from the TSV structures along the interface between two bonded substrates, thereby preventing electrical shorts.

Diffusion of materials across the original interface provides the adhesion strength between two bonded substrates in prior art bonding methods. Because the diffusion of materials across a bonding interface is thermally driven and the temperature of the anneal is limited for semiconductor substrates to a temperature range that does not cause decomposition of back-end-of-line (BEOL) dielectric materials, the bonding strength provided by conventional methods of substrate bonding can be limited.

BRIEF SUMMARY

Vertical stacks of a metal portion and a semiconductor portion formed on a first substrate are brought into physical contact with vertical stacks of a metal portion and a semiconductor portion formed on a second substrate. Alternately, vertical stacks of a metal portion and a semiconductor portion formed on a first substrate are brought into physical contact with metal portions formed on a second substrate. The assembly of the first and second substrates is subjected to an anneal at a temperature that induces formation of a metal semiconductor alloy derived from the semiconductor portions and the metal portions. The first substrate and the second substrate are bonded through metal semiconductor alloy portions that adhere to the first and second substrates. Electrically conductive paths can be formed across the first and second substrates through conductive structures that contact the metal semiconductor alloy portions or by through-substrate vias that are subsequently formed in the bonded structure.

According to an aspect of the present invention, a bonded structure is provided, which includes a vertical stack of a first substrate and a second substrate. The first substrate includes first dielectric material portions and the second substrate includes second dielectric material portions. Each of the second dielectric material portions contacts a surface of one of the first dielectric material portions at an interface plane between the first and second substrates. The first dielectric material portions and the second dielectric material portions laterally contact metal semiconductor alloy portions. Each of the metal semiconductor alloy portions extends across the interface into the first substrate and the second substrate.

According to another aspect of the present invention, a method of forming a bonded structure is provided, which includes forming first dielectric material portions on a surface of a first substrate; forming material stacks of a first metal portion and a first semiconductor portion on the first substrate; forming second dielectric material portions on a surface of a second substrate; forming metal-containing material portions including at least a second metal portion on the second substrate; and bringing the material stacks and the metal-containing material portions into physical contact at an interface plane and annealing the first and second substrates, whereby metal semiconductor alloy portions are formed across the interface plane by conversion of materials of the material stacks and the metal-containing material portions into a metal semiconductor alloy.

DETAILED DESCRIPTION

Figure 1:
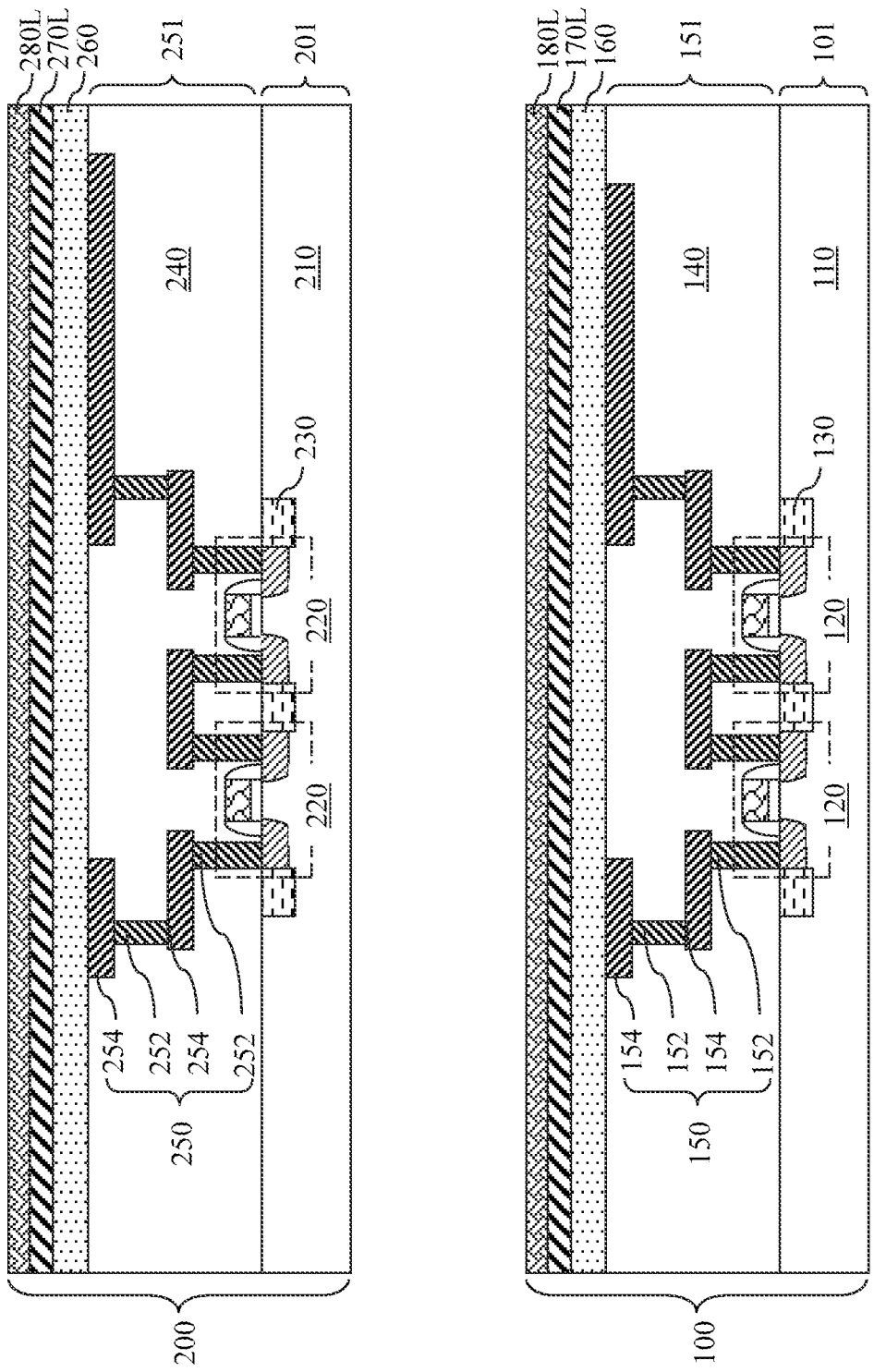
FIGS. 1-5 are sequential vertical cross-sectional views of a first exemplary structure according to a first embodiment of the present invention.

As stated above, the present invention relates to a bonded structure that provides bonding between multiple substrates through formation of a metal semiconductor alloy and methods of manufacturing the same, which are now described in detail with accompanying figures. It is noted that like reference numerals refer to like elements across different embodiments. The drawings are not necessarily drawn to scale.

As used herein, a "metal" refers to any elemental metal in the Periodic Table of Elements.

As used herein, a "non-metal" refers to any element that is not an elemental metal in the Periodic Table of Elements.

As used herein, a "metallic material" is a material including at least one elemental metal. A metallic material may consist of an elemental metal, an intermetallic alloy of at least two elemental metals, or an alloy of at least one elemental metal and at least one non-metallic element.

As used herein, an "intermetallic alloy" is an alloy consisting of at least two elemental metals.

As used herein, a "metallic alloy" is a conductive alloy including at least one elemental metal and at least another element.

As used herein, a "conductive line structure" refers to a conductive structure that extends in a direction within a plane that is parallel to a surface of a substrate on which the conductive line structure is located.

As used herein, a "conductive via structure" refers to a conductive structure that extends in a direction that is nominally perpendicular to a plane that is parallel to a surface of a substrate on which the conductive via structure is located.

As used herein, a "conductive wiring structures" include conductive line structures that provide electrical connection within a plane and conductive via structures that provide electrical connection in a direction nominally perpendicular to said plane.

As used herein, a "metal-containing material portion" is a portion of a material that includes at least one elemental metal.

As used herein, "transition metals" include elements in Groups IVB, VB, VIB, VIIB, VIIIB, IB, and IIB other than Actinides and Lanthanides.

As used herein, "Lanthanides" includes element having an atomic number from 57 to 71.

As used herein, "Actinides" includes elements having an atomic number from 89 to 103.

Referring to FIG. 1, a first exemplary structure according to a first embodiment of the present invention includes a first substrate 100 and a second substrate 200 that are separated from each other. The first substrate 100 can include a first semiconductor substrate 101 and a first interconnect-level structure 151. The second substrate 200 can include a second semiconductor substrate 201 and a second interconnect-level structure 251.

The first semiconductor substrate 101 includes a first semiconductor layer 110. At least one first semiconductor device 120 can be present on the first semiconductor layer 110.

Likewise, the second semiconductor substrate 201 includes a second semiconductor layer 210. At least one second semiconductor device 220 can be present on the second semiconductor layer 210. Each of the at least one first semiconductor device 120 and the at least one second semiconductor device 220 can be, but is not limited to, a field effect transistor, a bipolar transistor, a diode, a resistor, a capacitor, a varactor, an inductor, a carbon nanotube device, or any other type of semiconductor device or a nanoscale device. As an illustrative example, field effect transistors are depicted as the at least one first semiconductor device 120 and the at least one second semiconductor device 220 in FIG. 1. A buried insulator layer (not shown) and/or a handle substrate (not shown) can be present within the first semiconductor layer 110 and/or the second semiconductor layer 210.

Each of the first semiconductor layer 110 and the second semiconductor layer 210 includes a semiconductor material. Preferably, the semiconductor material can be a single crystalline semiconductor material having an epitaxial alignment among atoms within the entirety of the top semiconductor layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon.

The first interconnect level structure 151 includes at least one first dielectric material layer 140 and first conductive wiring structures 150 embedded therein. The first conductive wiring structures 150 can include first conductive via structures 152 and first conductive line structures 154. The second interconnect level structure 251 includes at least one second dielectric material layer 240 and second conductive wiring structures 250 embedded therein. The second conductive wiring structures 250 can include second conductive via structures 252 and second conductive line structures 254.

Each of the at least one first dielectric material layer 140 and the at least one second dielectric material layer 240 includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoK™, or any other type of dielectric material that can be deposited or formed on a substrate and able to hold at least one metal pad therein. The first conductive wiring structures 150 embedded in the at least one first dielectric material layer 140 provide electrical connection to the at least one first semiconductor device 120. Likewise, second conductive wiring structures 250 embedded in the at least one second dielectric material layer 214 provide electrical connection to the at least one second semiconductor device 220.

Each of the at least one first dielectric material layer 140 and the at least one second dielectric material layer 240 can include a plurality of dielectric material layers having different compositions. The composition of the at least one first dielectric material layer 140 and the at least one second dielectric material layer 240 can include any dielectric material known in semiconductor processing technology and can be adjusted as needed.

A first planar dielectric layer 160 can be optionally formed on the top surface of the first interconnect level structure 151. The first planar dielectric layer 160 can be deposited on a planar top surface of the first interconnect level structure 151. Likewise, a second planar dielectric layer 260 can be optionally formed on the top surface of the second interconnect level structure 251. The second planar dielectric layer 260 can be deposited on a planar top surface of the second interconnect level structure 251. Each of the first planar dielectric layer 160 and the second planar dielectric layer includes a dielectric material such as silicon oxide, silicon nitride, silicon oxynitride, organosilicate glass (OSG), or any other dielectric material that can be employed for the at least one first dielectric material layer 140 or the at least one second dielectric material layer 240. The thickness of the first planar dielectric layer 160 and the thickness of the second planar dielectric layer 260 can be from 10 nm to 1,000 nm, although lesser and greater thicknesses can also be employed.

A stack of a first metal layer 170L and a first semiconductor layer 180L is deposited. The first metal layer 170L is deposited on the exposed top surface of the first substrate 100, which can be the surface of the first interconnect level structure 151 or the surface of the first planar dielectric layer 160. The first semiconductor layer 180L is deposited on the surface of the first metal layer 170L. Each of the first metal layer 170L and the first semiconductor layer 180L is deposited as a contiguous blanket layer. Upon deposition, the stack of the first metal layer 170L and the first semiconductor layer 180L is incorporated into the first substrate 100.

Likewise, a stack of a second metal layer 270L and a second semiconductor layer 280L is deposited. The second metal layer 270L is deposited on the exposed top surface of the second substrate 200, which can be the surface of the second interconnect level structure 251 or the surface of the second planar dielectric layer 260. The second semiconductor layer 280L is deposited on the surface of the second metal layer 270L. Each of the second metal layer 270L and the second semiconductor layer 280L is deposited as a contiguous blanket layer. Upon deposition, the stack of the second metal layer 270L and the second semiconductor layer 280L is incorporated into the second substrate 200.

Each of the first metal layer 170L and the second metal layer 270L includes at least one metal selected from transition metals, Lanthanides, and Actinides. Each of the first metal layer 170L and the second metal layer 270L can be composed of a single elemental metal selected from transition metals, Lanthanides, and Actinides, or can be composed of an intermetallic alloy of at least two elements selected from transition metals, Lanthanides, and Actinides.

Preferably, each of the first metal layer 170L and the second metal layer 270L includes at least 30% Ni in atomic percentage. More preferably, each of the first metal layer 170L and the second metal layer 270L includes at least 50% Ni in atomic percentage. Each of the first metal layer 170L and the second metal layer 270L can consist of Ni, or can be composed of an intermetallic alloy including Ni at an atomic concentration of at least 30%, or preferably at an atomic concentration of at least 50%.

Each of the first metal layer 170L and the second metal layer 270L can be deposited by physical vapor deposition (PVD), chemical vapor deposition (CVD), evaporation, electroless plating, electroplating, or a combination thereof. The thickness of the first metal layer 170L and the thickness of the second metal layer 270L can be independently from 5 nm to 300 nm, and typically from 15 nm to 100 nm, although lesser and greater thicknesses can also be employed.

Each of the first semiconductor layer 180L and the second semiconductor layer 280L includes at least one semiconductor material selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, each of the first semiconductor layer 180L and the second semiconductor layer 280L includes at least one element selected from Si and Ge. For example, each of the first semiconductor layer 180L and the second semiconductor layer 280L can be composed of a semiconductor material selected from silicon, germanium, a silicon-germanium alloy, a silicon-carbon alloy, a germanium-carbon alloy, or a silicon-germanium-carbon alloy.

Each of the first semiconductor layer 180L and the second semiconductor layer 280L can be deposited by plasma enhanced chemical vapor deposition (PECVD), low pressure chemical vapor deposition (LPCVD), physical vapor deposition (PVD), or a combination thereof. The thickness of the first semiconductor layer 180L and the thickness of the second semiconductor layer 280L can be independently from 5 nm to 100 nm, and typically from 10 nm to 30 nm, although lesser and greater thicknesses can also be employed.

Figure 2:
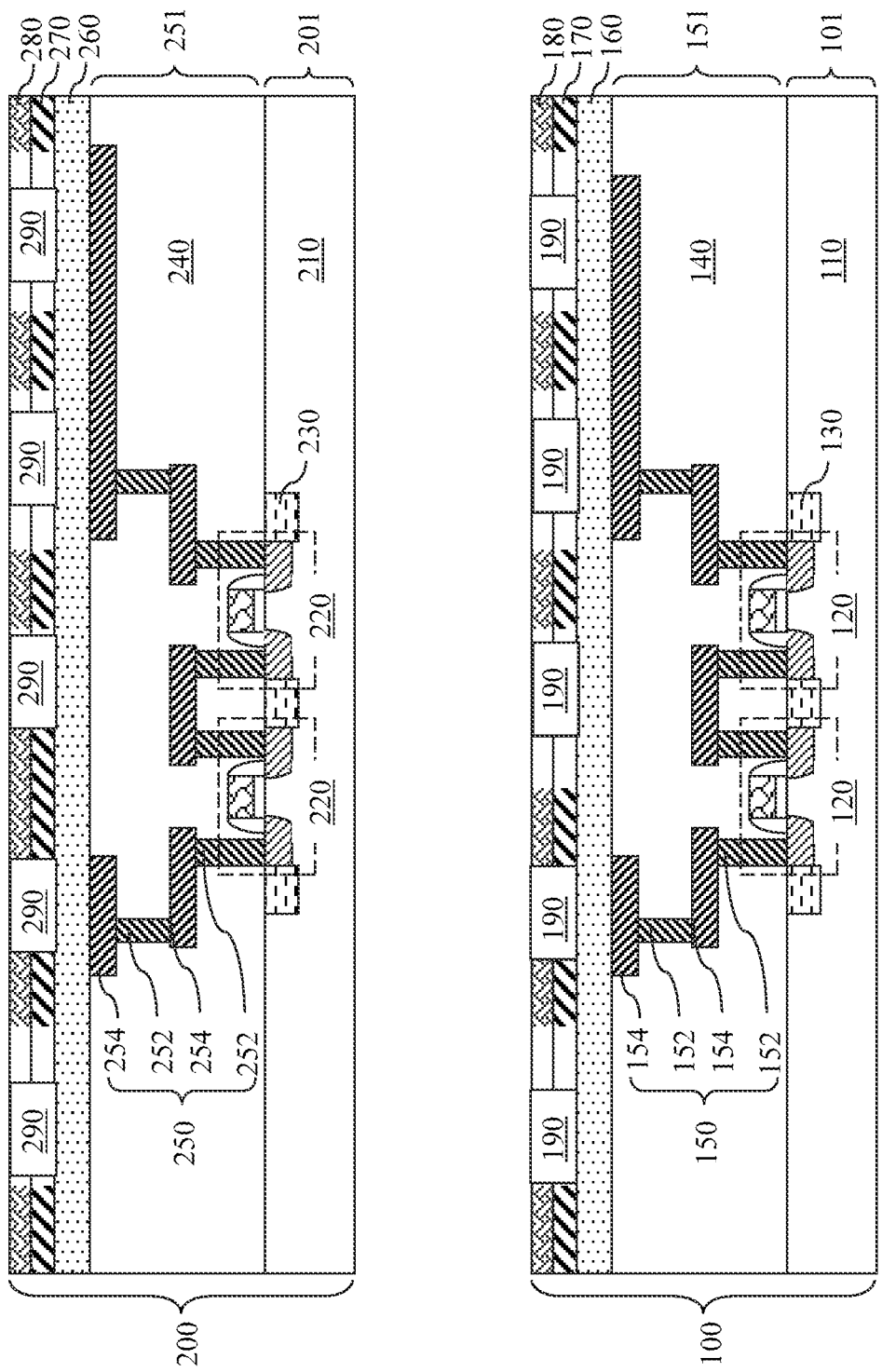

Referring to FIG. 2, the stack of the first metal layer 170L and the first semiconductor layer 180L is patterned to form trenches therein. The stack of the first metal layer 170L and the first semiconductor layer 180L can be patterned, for example, by a combination of lithographic methods that forms a patterned photoresist and an etch that transfers the pattern in the openings of the patterned photoresist into the stack of the first metal layer 170L and the first semiconductor layer 180L. A top surface of the first planar dielectric layer 160 is exposed at the bottom of each trench in the stack of the first metal layer 170L and the first semiconductor layer 180L. The remaining portions of the first metal layer 170L and the first semiconductor layer 180L form first metal-containing material portions, each of which is a first material stack of a first metal portion 170 and a first semiconductor portion 180. Each first metal-containing material portion can be laterally spaced by the trenches on the first substrate 100.

Similarly, the stack of the second metal layer 270L and the second semiconductor layer 280L is patterned to form trenches therein. A top surface of the second planar dielectric layer 260 is exposed at the bottom of each trench in the stack of the second metal layer 270L and the second semiconductor layer 280L. Preferably, the pattern of trenches in the stack of the first metal layer 170L and the first semiconductor layer 180L is a mirror image of the pattern of trenches in the stack of the second metal layer 270L and the second semiconductor layer 280L. The remaining portions of the second metal layer 270L and the second semiconductor layer 280L form second metal-containing material portions, each of which is a second material stack of a second metal portion 270 and a second semiconductor portion 280. Each second metal-containing material portion can be laterally spaced by the trenches on the second substrate 200.

A first dielectric material is deposited in the trenches among remaining portions of the first metal layer 170L and the first semiconductor layer 180L, and is planarized to form first dielectric material portions 190. The first dielectric material above the top surface of the first semiconductor layer 180L is removed during a planarization step so that remaining portions of the first semiconductor layer 180 is exposed after the planarization step. The top surfaces of the first semiconductor portions 180 and the top surfaces of the first dielectric material portions 190 can be coplanar. The first metal-containing material portions (170, 180) and the first dielectric material portions 190 complimentarily fill the entirety of the layer between the top surface of the first planar dielectric layer 160 and the plane of the top surfaces of the first semiconductor portions 180 and the first dielectric material portions 190.

Likewise, a second dielectric material is deposited in the trenches among remaining portions of the second metal layer 270L and the second semiconductor layer 280L, and is planarized to form second dielectric material portions 290. The second dielectric material above the top surface of the second semiconductor portions 280 is removed during a planarization step so that remaining portions of the second semiconductor layer 280 is exposed after the planarization step. The top surfaces of the second semiconductor portions 280 and the top surfaces of the second dielectric material portions 290 can be coplanar. The second metal-containing material portions (270, 280) and the second dielectric material portions 290 complimentarily fill the entirety of the layer between the top surface of the second planar dielectric layer 260 and the plane of the top surfaces of the second semiconductor portions 280 and the second dielectric material portions 290.

Figure 3:
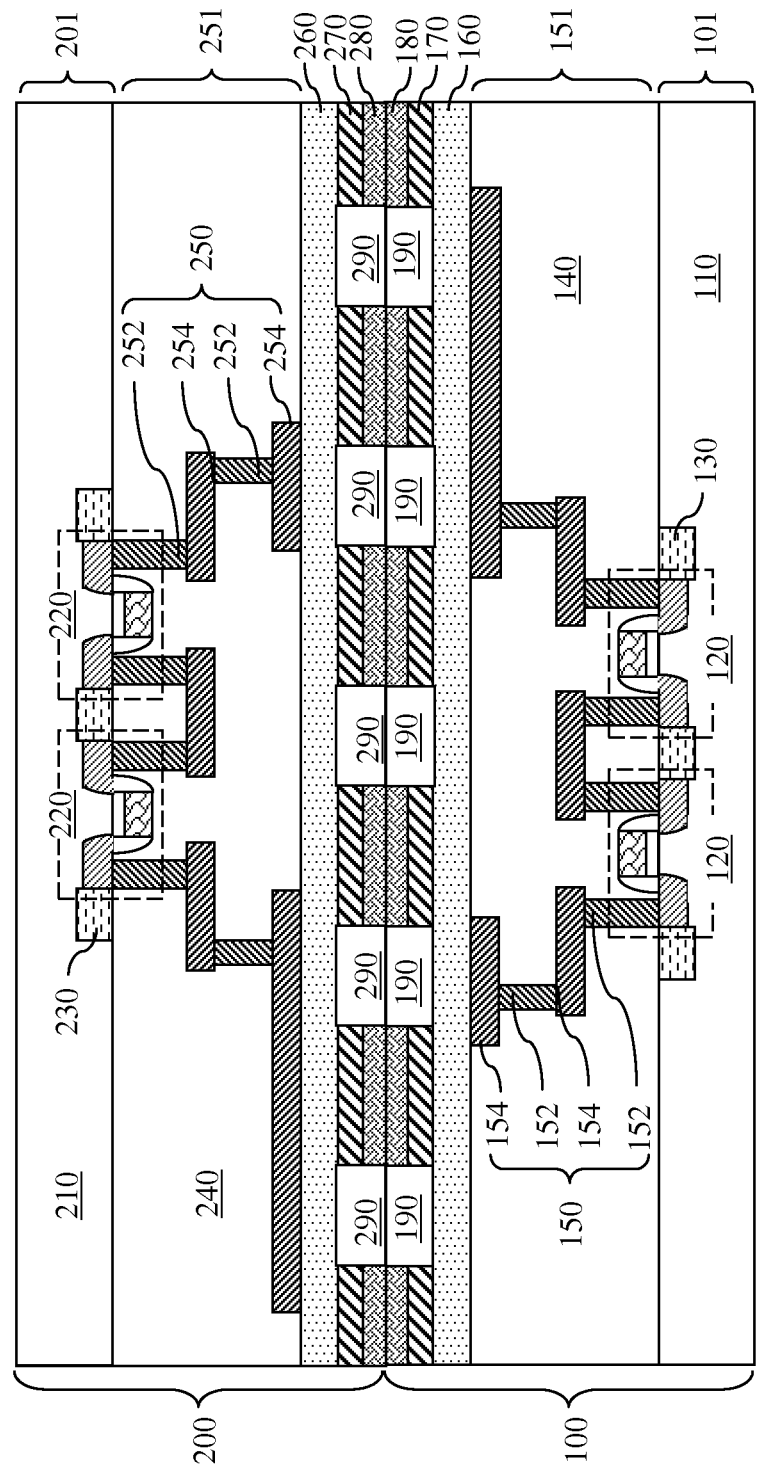

Referring to FIG. 3, the second substrate 200 is flipped upside down. Subsequently, the first substrate 100 and the second substrate 200 are brought into physical contact with each other. Preferably, the first metal-containing material portions (170, 180) and the second metal-containing material portions (270, 280) are brought into contact with each other so that a surface of each second semiconductor portion 280 contacts a surface of one of the first semiconductor portions 180 at an interface plane. Preferably, a surface of each of the first semiconductor portions 180 contacts a surface of one of the second semiconductor portions 280 when the first metal-containing material portions (170, 180) and the second metal-containing material portions (270, 280) are brought into contact with each other. The interface plane is the plane of the top surfaces of the first semiconductor portions 180 and first dielectric material portions 190 as well as the plane of the top surfaces (now located at the bottommost portion of the second substrate 200 after flipping upside down) of the second semiconductor portions 280 and the second dielectric material portions 290.

Figure 4:
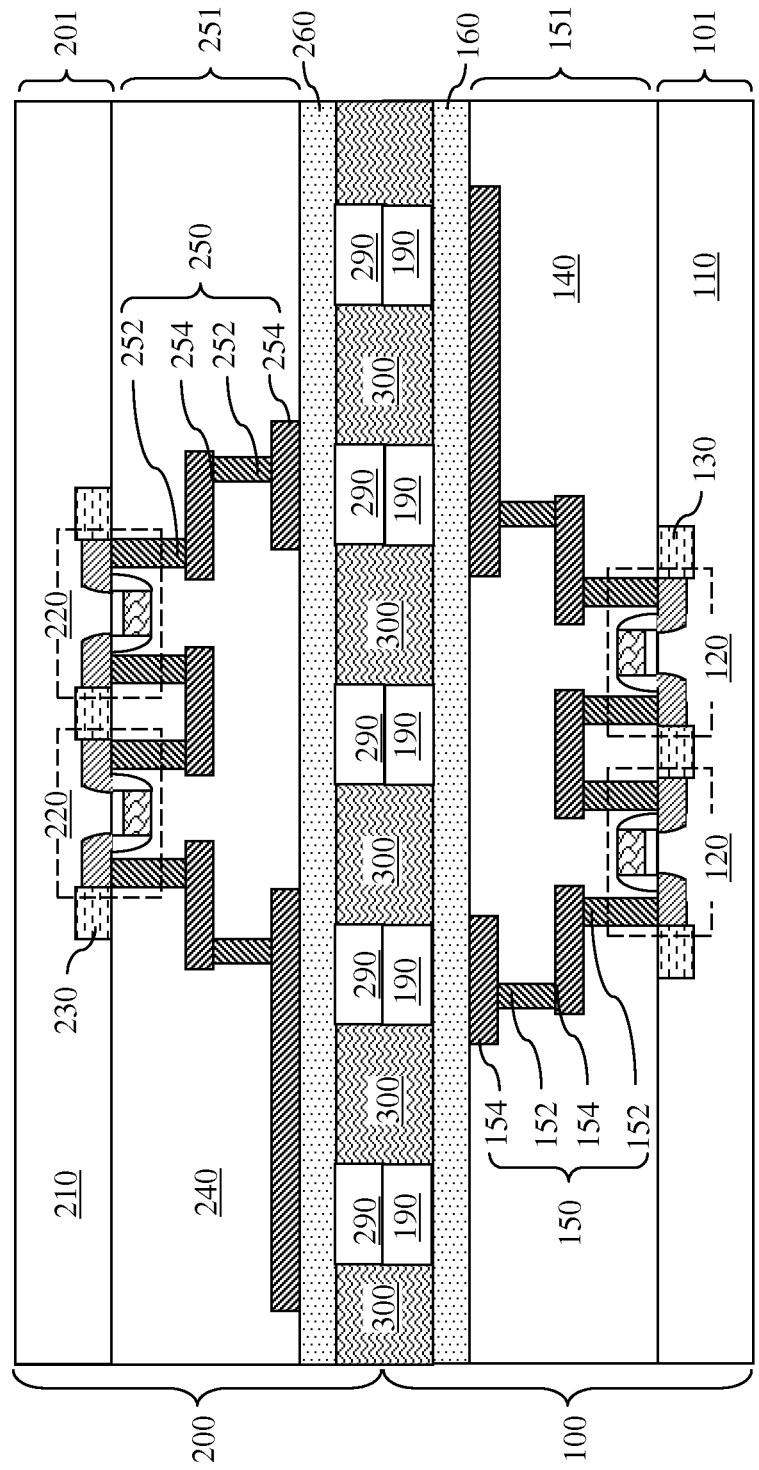

Referring to FIG. 4, metal semiconductor alloy portions 300 are formed across the interface plane by conversion of materials of the first metal-containing material portions (170, 180) and the second metal-containing material portions (270, 280) into a metal semiconductor alloy. The conversion can be effected by an anneal process, which can be performed, for example, at a temperature from 300° C. to 500° C. A bonded structure including a vertical stack of the first substrate 100 and the second substrate 200 is thereby formed. Each of the second dielectric material portions 290 contacts a surface of one of the first dielectric material portions 190 at an interface plane between the first and second substrates (100, 200). The first dielectric material portions 190 and the second dielectric material portions 290 laterally surround metal semiconductor alloy portions 300. Each of the metal semiconductor alloy portions 300 extends across the interface into the first substrate 100 and the second substrate 200. The metal semiconductor alloy portions 300 provides adhesive force to the first substrate 100 and the second substrate 200, thereby providing bonding between the first and second substrates (100, 200). Further, the contact between the first and second dielectric material portions (190, 290) can induce diffusion of materials across the interface plane to provide additional adhesive force in some cases.

The materials of the first semiconductor portions 180 and the second semiconductor portions 280 diffuse across the interface plane during the formation of the metal semiconductor alloy. Further, the materials of the first metal portions 170 and the second metal portions 270 can also diffuse toward the interface plane during the formation of the metal semiconductor alloy. In one case, the entirety of each metal semiconductor alloy portion 300 is a homogeneous metal semiconductor alloy. In another case, a metal semiconductor alloy portion 300 can have a heterogeneous composition in which a metal semiconductor alloy is present around the interface plane and a metal or a metallic alloy is present in at least one end portion of the metal semiconductor alloy portion 300. If present, the metal or the metal alloy contacts one of the first and second planar dielectric layers (160, 260) or one of the first and interconnect level structures (151, 251).

Each metal semiconductor alloy portion 300 includes an alloy of at least one metal and at least one semiconductor material. The at least one metal is derived from the first metal portions 170 and the second metal portions 270 (See FIG. 3). Thus, the at least one metal is selected from transition metals, Lanthanides, and Actinides. Further, the at least one semiconductor material is derived from the first semiconductor portions 180 and the second semiconductor portions 280. (See FIG. 3). Thus, the at least one semiconductor material is selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the at least one semiconductor material includes at least one element selected from Si and Ge. In this case, the metal semiconductor alloy portions 300 include a metal silicide, a metal germanide, or a metal germanosilicide.

If nickel is included in the first metal portions 170 or the second metal portions 270, the metal semiconductor alloy portions 300 include Ni. Preferably, the metal semiconductor alloy portions 300 include a nickel silicide, a nickel germanide, or a nickel germanosilicide. The metal semiconductor alloy portions 300 can be composed of a nickel silicide, a nickel germanide, or a nickel germanosilicide. Alternately, the metal semiconductor alloy portions 300 can include an alloy of a nickel silicide and a silicide of at least another metal, an alloy of a nickel germanide and a germanide of at least another metal, or an alloy of a nickel germanosilicide and a germanosilicide of at least another metal.

The first interconnect-level structure 151 is more proximal to the interface plane than the first semiconductor substrate 101, and the second interconnect-level structure 251 is more proximal to the interface than the second semiconductor substrate 201. The first planar dielectric layer 160, if present, is located between the at least one first semiconductor device 120 and the interface plane and contacts the first dielectric material portions 190 and one end of each of the metal semiconductor alloy portions 300. The second planar dielectric layer 260, if present, is located between the at least one second semiconductor device 220 and the interface plane and contacts the second dielectric material portions 290 and another end of the metal semiconductor alloy portions 300.

Figure 5:
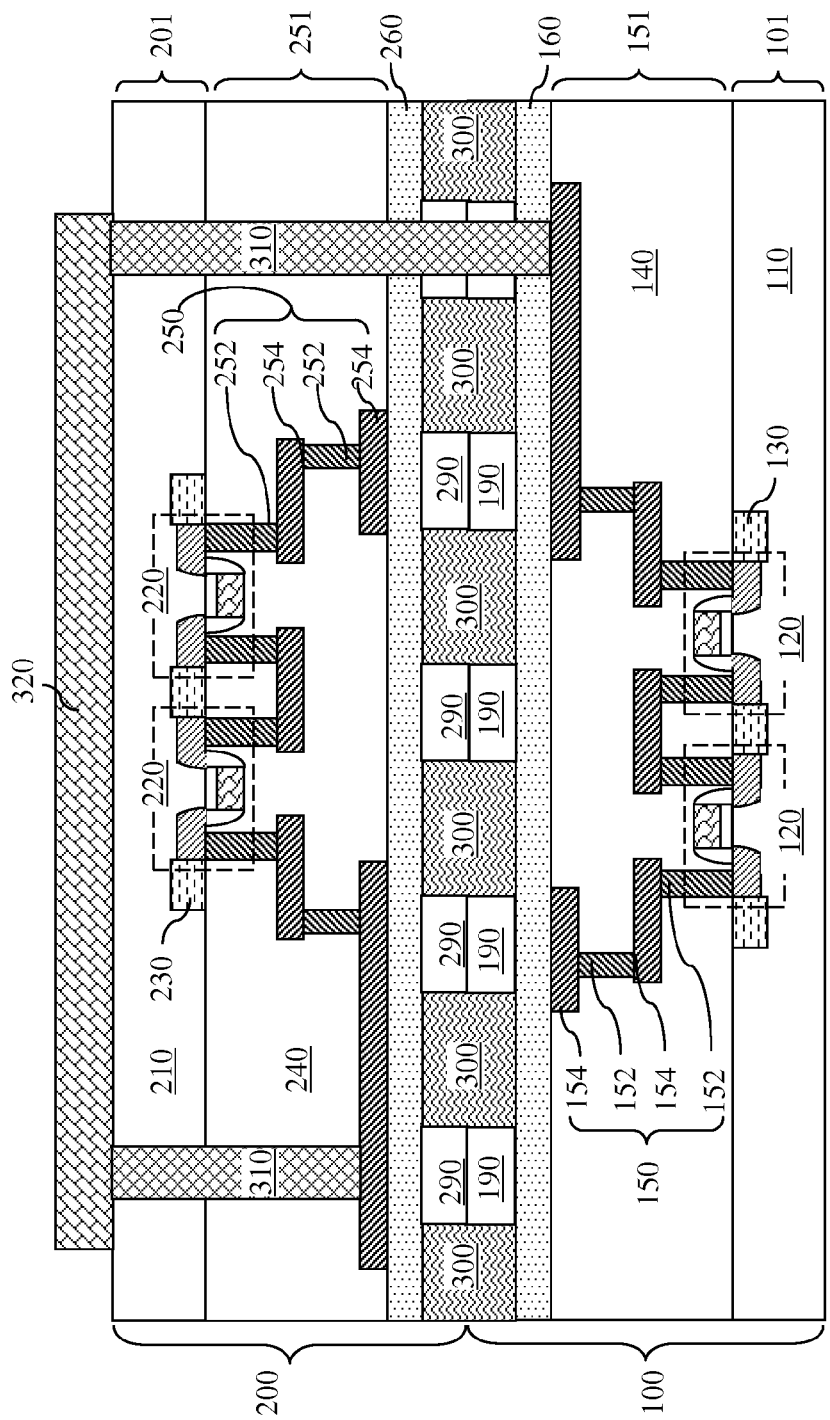

Referring to FIG. 5, at least two through-substrate via structures 310 that extend through the second substrate 200 are formed by methods known in the art. Dielectric liners (not shown) can be formed around each of the at least two through-substrate via structures 310 to electrically isolate the at least two through-substrate via structures 310 from the second semiconductor substrate 201 and the at least one second dielectric material layer 240. A through-substrate via structure 310 can contact one of the second conductive wiring structures 250 or one of the first conductive wiring structures 150. If a through-substrate via structure 310 contacts one of the first conductive wiring structures 150, the through-substrate via structure 310 can pass through a stack of a first dielectric material portion 190 and a second dielectric material portion 290, or through a metal semiconductor alloy portion 300.

At least one metal line 320 can be formed on the outer surface of the second substrate 200, i.e., the exposed surface of the second semiconductor substrate 201, by method known in the art. The at least one metal line 320 contacts the at least two through-substrate via structures 310 to provide at least one conductive electrical connection between the at least one first semiconductor devices 120 and the at least one second semiconductor devices 220.

Figure 6:
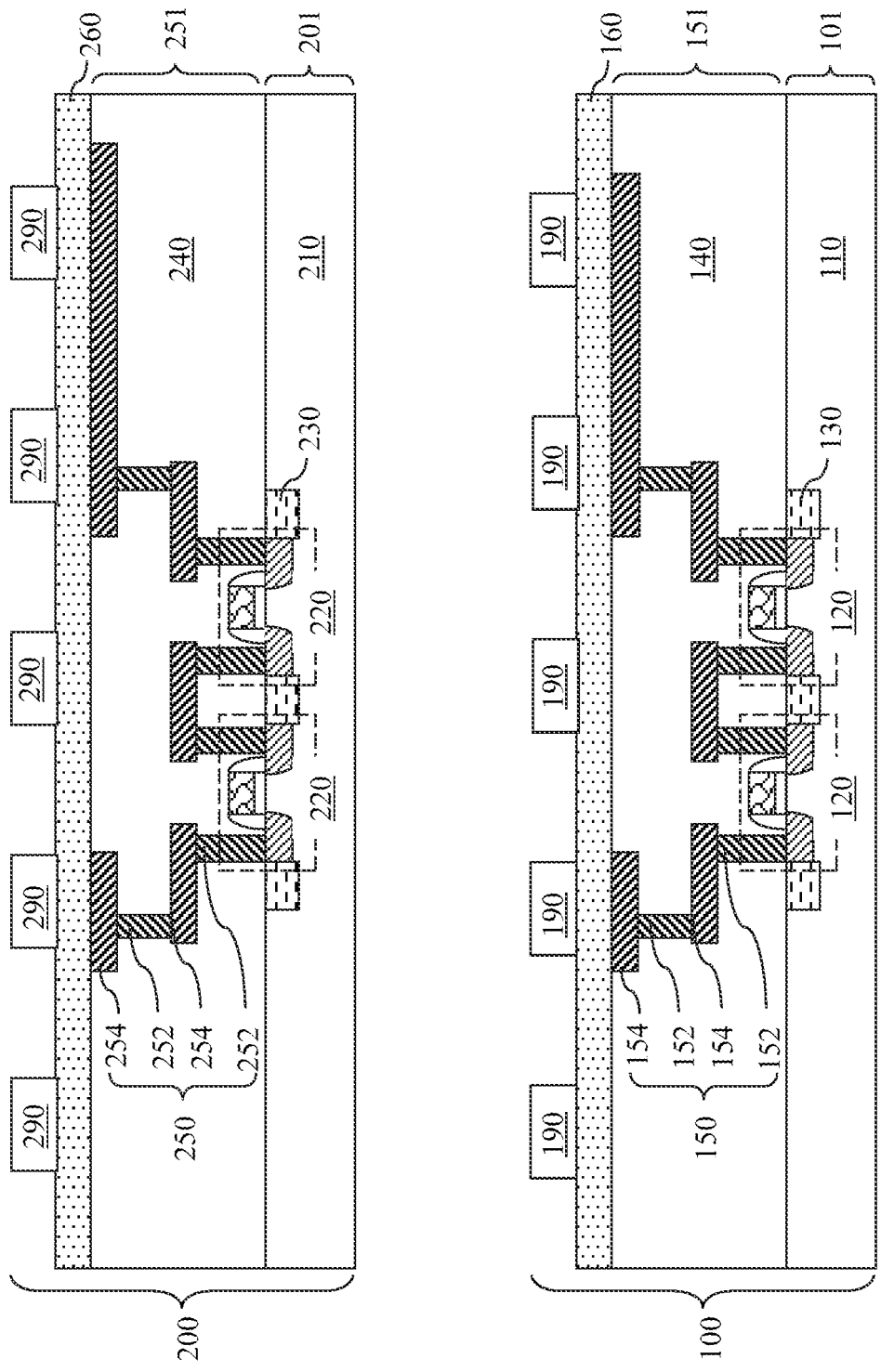
FIGS. 6-8 are sequential vertical cross-sectional views of a second exemplary structure according to a second embodiment of the present invention.

Referring to FIG. 6, a second exemplary structure according to a second embodiment of the present invention can be provided by modifying the process of forming the first exemplary structure of FIG. 1. Specifically, instead of forming a first metal layer 170L and a second metal layer 180L (See FIG. 1), a first dielectric material portions 190 is formed on the first substrate 100. The first dielectric material portions 190 can be formed, for example, by depositing a first dielectric material layer (not shown) on a surface of the first substrate 100 as a contiguous blanket layer, and by patterning the first dielectric material layer to form trenches therein. The first dielectric material portions 190 are formed on the first substrate 100, and the first dielectric material portions 190 are laterally spaced by the trenches.

Likewise, instead of forming a second metal layer 270L and a second metal layer 280L (See FIG. 1), a second dielectric material portions 290 is formed on the second substrate 200. The second dielectric material portions 290 can be formed, for example, by depositing a second dielectric material layer (not shown) on a surface of the second substrate 200 as a contiguous blanket layer, and by patterning the second dielectric material layer to form trenches therein. The second dielectric material portions 290 are formed on the second substrate 200, and the second dielectric material portions 290 are laterally spaced by the trenches.

Figure 7:
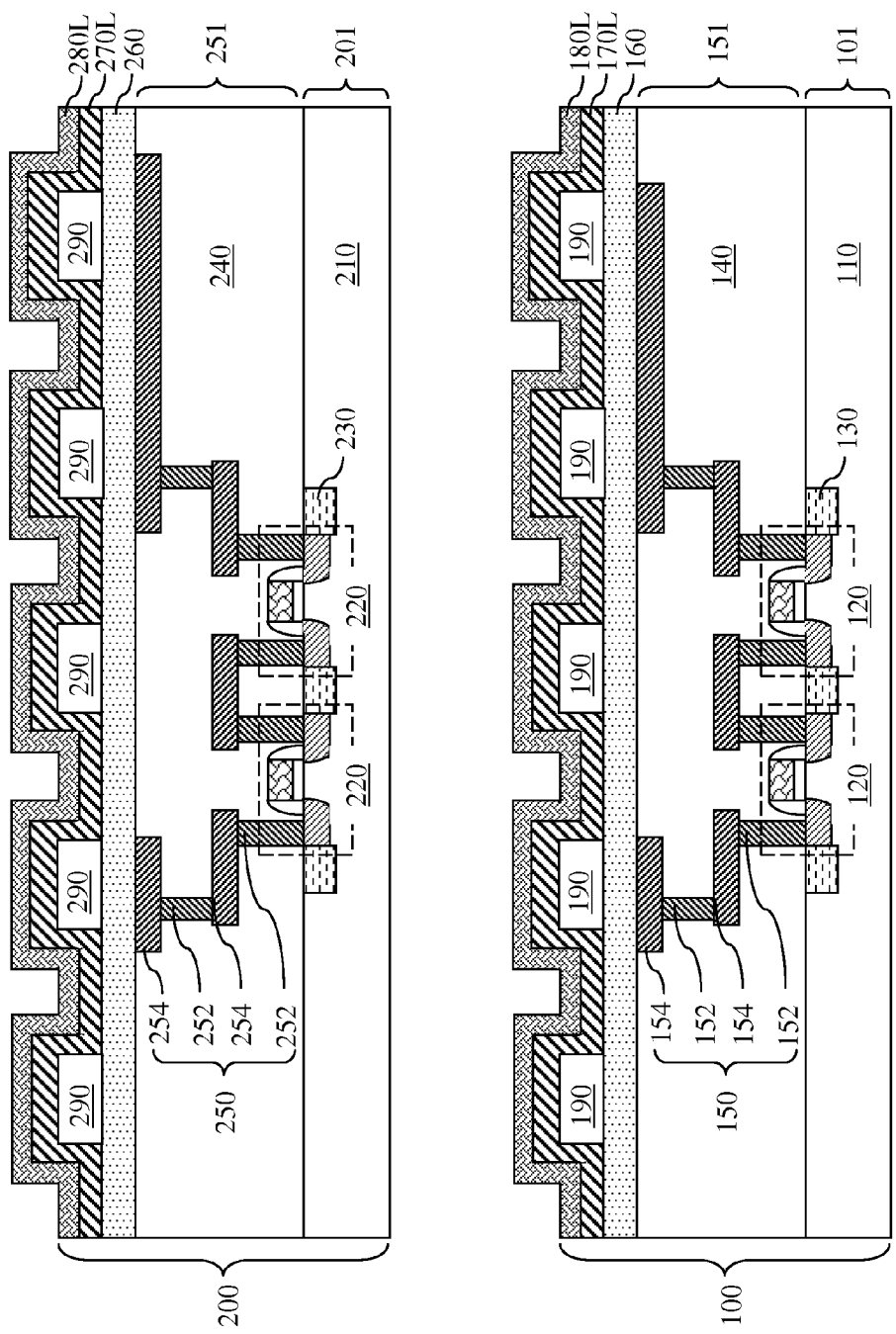

Referring to FIG. 7, a stack of a first metal layer 170L and a first semiconductor layer 180L is deposited over the first dielectric material portions 190 and in the trenches on the first substrate 100. Surfaces of the first metal layer 170L and the first semiconductor layer 180L replicate the underlying topography generated by the first dielectric material portions 190. The composition and thickness of each of the first metal layer 170L and the first semiconductor layer 180L can be the same as in the first embodiment.

Likewise, a stack of a second metal layer 270L and a second semiconductor layer 280L is deposited over the second dielectric material portions 290 and in the trenches on the second substrate 200. Surfaces of the second metal layer 270L and the second semiconductor layer 280L replicate the underlying topography generated by the second dielectric material portions 290. The composition and thickness of each of the second metal layer 270L and the second semiconductor layer 280L can be the same as in the first embodiment.

Figure 8:
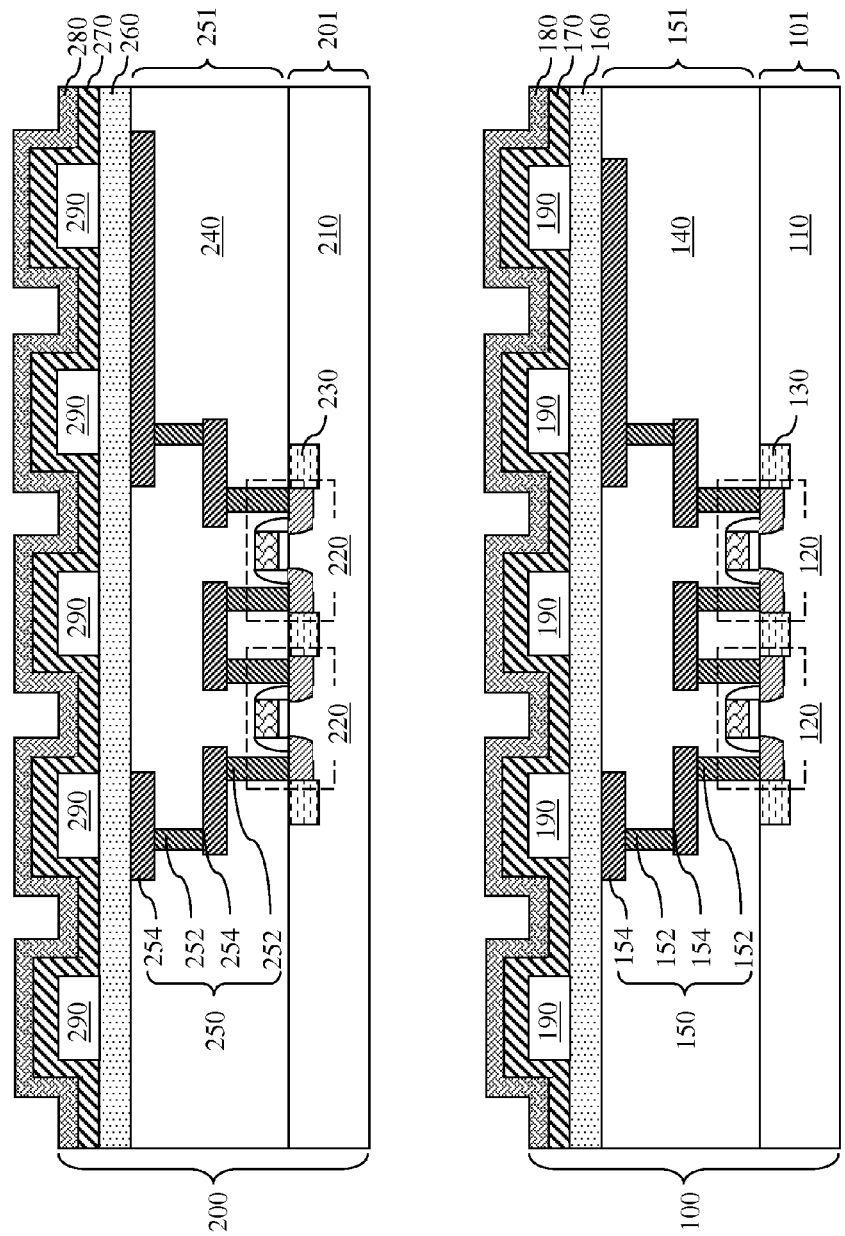

Referring to FIG. 8, the portions of the stack of a first metal layer 170L and the first semiconductor layer 180L above the first dielectric material portions 190 is planarized. Top surfaces of the first dielectric material portions 190 can be employed as a stopping layer. The remaining portions of the first metal layer 170L and the first semiconductor layer 180L constitute first metal-containing material portions, each of which is a first material stack of a first metal portion 170 and a first semiconductor portion 180. Each first metal-containing material portion can be laterally spaced by the first dielectric material portions 190 on the first substrate 100. Each first semiconductor portion 180 is spaced from the first dielectric material portions 190 by at least one first metal portion 170. The first metal-containing material portions (170, 180) and the first dielectric material portions 190 complimentarily fill the entirety of the layer between the top surface of the first planar dielectric layer 160 and the plane of the top surfaces of the first semiconductor portions 180 and the first dielectric material portions 190.

Likewise, the portions of the stack of a second metal layer 270L and the second semiconductor layer 280L above the second dielectric material portions 290 is planarized. Top surfaces of the second dielectric material portions 290 can be employed as a stopping layer. The remaining portions of the second metal layer 270L and the second semiconductor layer 280L constitute second metal-containing material portions, each of which is a second material stack of a second metal portion 270 and a second semiconductor portion 280. Each second metal-containing material portion can be laterally spaced by the second dielectric material portions 290 on the second substrate 200. Each second semiconductor portion 280 is spaced from the second dielectric material portions 290 by at least one second metal portion 270. The second metal-containing material portions (270, 280) and the second dielectric material portions 290 complimentarily fill the entirety of the layer between the top surface of the second planar dielectric layer 260 and the plane of the top surfaces of the second semiconductor portions 280 and the second dielectric material portions 290.

The second substrate 200 is subsequently flipped upside down, and the first substrate 100 and the second substrate 200 are brought into physical contact with each other as illustrated in FIG. 3 of the first embodiment. Preferably, the first metal-containing material portions (170, 180) and the second metal-containing material portions (270, 280) are brought into contact with each other so that a surface of each second semiconductor portion 280 contacts a surface of one of the first semiconductor portions 180 at an interface plane. Preferably, a surface of each of the first semiconductor portions 180 contacts a surface of one of the second semiconductor portions 280 when the first metal-containing material portions (170, 180) and the second metal-containing material portions (270, 280) are brought into contact with each other. The interface plane is the plane of the top surfaces of the first semiconductor portions 180 and first dielectric material portions 190 as well as the plane of the top surfaces (now located at the bottommost portion of the second substrate 200 after flipping upside down) of the second semiconductor portions 280 and the second dielectric material portions 290. Subsequently, the same processing steps can be employed to form metal semiconductor alloy portions 300 as illustrated in FIG. 4 and optionally to form at least two through-substrate via structures 310 and at least one metal line 320 as illustrated in FIG. 5.

Figure 9:
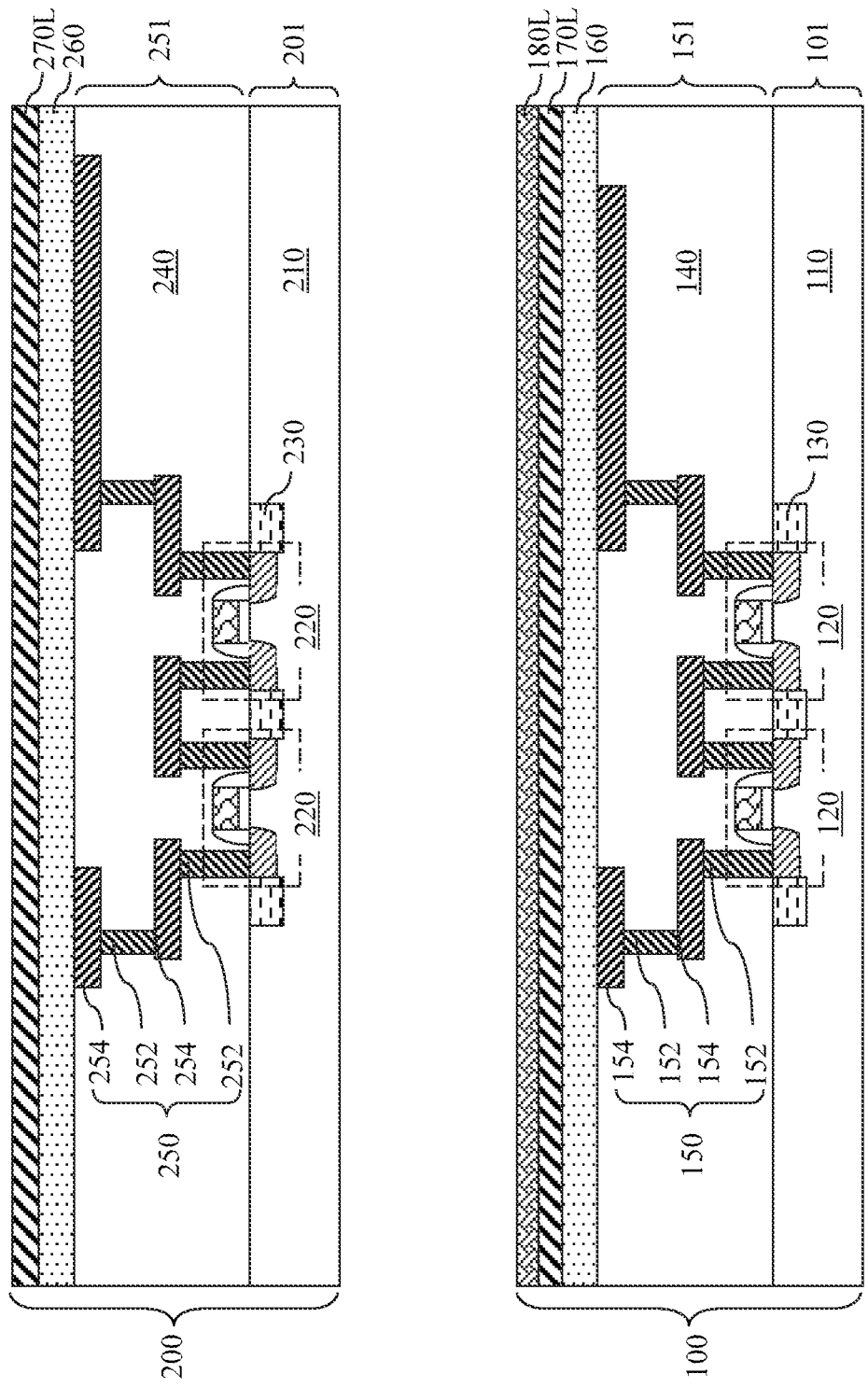
FIGS. 9 and 10 are sequential vertical cross-sectional views of a third exemplary structure according to a third embodiment of the present invention.

Referring to FIG. 9, a third exemplary structure according to a third embodiment of the present invention is derived from the first exemplary structure of FIG. 1 by omitting the formation of a second semiconductor layer 280L (See FIG. 1). The first metal layer 170L, the first semiconductor layer 180L, and the second metal layer 270L can be the same as in the first embodiment.

Figure 10:
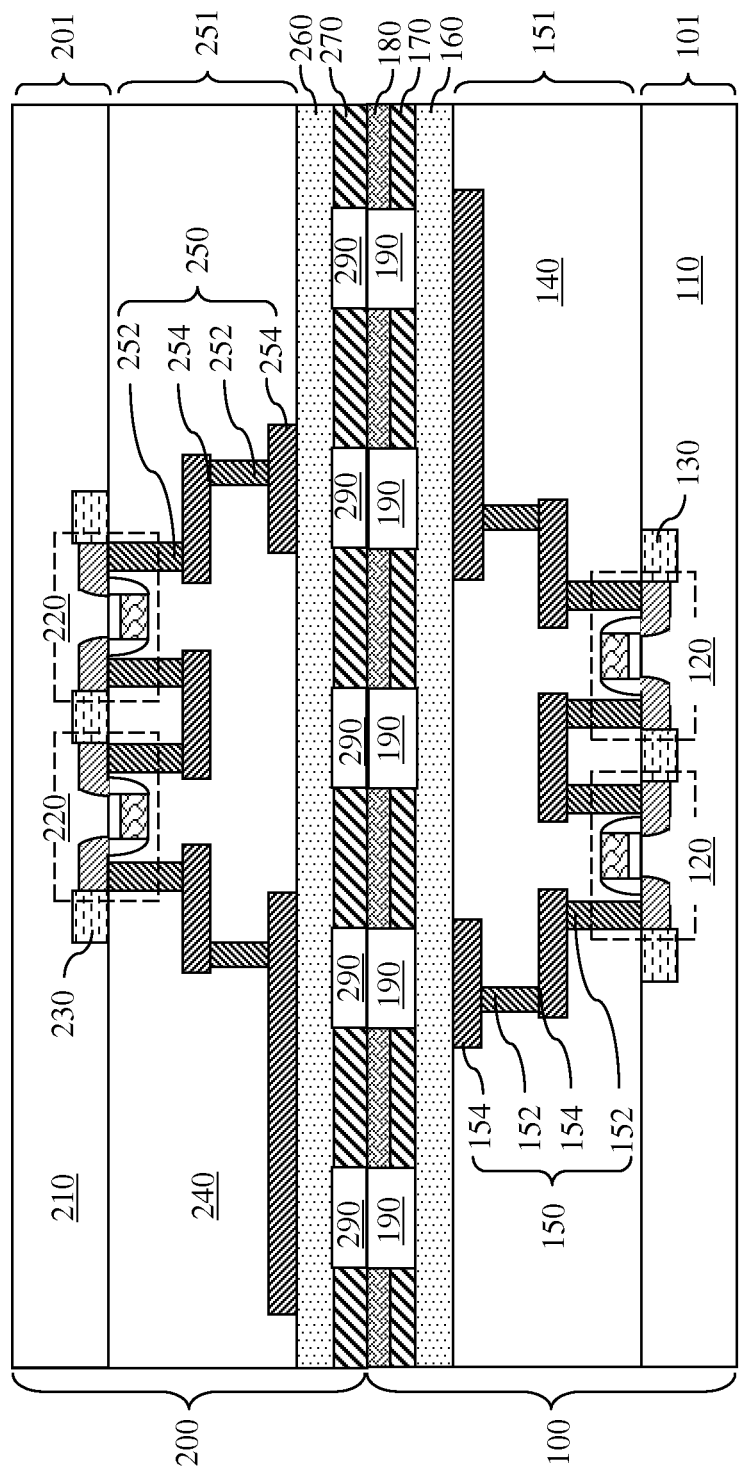

Referring to FIG. 10, first metal-containing material portions and first dielectric material portions 190 are formed in the same manner as in the first embodiment. Each of the first metal-containing material portions is a first material stack of a first metal portion 170 and a first semiconductor portion 180. The first metal-containing material portions (170, 180) and the first dielectric material portions 190 complimentarily fill the entirety of the layer between the top surface of the first planar dielectric layer 160 and the plane of the top surfaces of the first semiconductor portions 180 and the first dielectric material portions 190.

The second metal layer 270L is patterned to form trenches therein. A top surface of the second planar dielectric layer 260 is exposed at the bottom of each trench in the stack of the second metal layer 270L and the second semiconductor layer 280L. Preferably, the pattern of trenches in the stack of the first metal layer 170L and the first semiconductor layer 180L is a mirror image of the pattern of trenches in the second metal layer 270L. The remaining portions of the second metal layer 270L form second metal-containing material portions, each of which is a second metal portion 270. Each second metal-containing material portion can be laterally spaced by the trenches on the second substrate 200.

A second dielectric material is deposited into the trenches among the remaining portions of the second metal layer 270L and planarized to form second dielectric material portions 290. The second dielectric material above the top surface of the second metal portions 270 is removed during a planarization step so that remaining portions of the second metal portions 270 is exposed after the planarization step. The top surfaces of the second metal portions 270 and the top surfaces of the second dielectric material portions 290 can be coplanar. The second metal portions 270 and the second dielectric material portions 290 complimentarily fill the entirety of the layer between the top surface of the second planar dielectric layer 260 and the plane of the top surfaces of the second metal portions 270 and the second dielectric material portions 290.

The second substrate 200 is subsequently flipped upside down, and the first substrate 100 and the second substrate 200 are brought into physical contact with each other. Preferably, the first metal-containing material portions (170, 180) and the second metal-containing material portions, which are second metal portions 270, are brought into contact with each other so that a surface of each second metal portion 270 contacts a surface of one of the first semiconductor portions 180 at an interface plane. Preferably, a surface of each of the first semiconductor portions 180 contacts a surface of one of the second metal portions 270 when the first metal-containing material portions (170, 180) and the second metal-containing material portions are brought into contact with each other. The interface plane is the plane of the top surfaces of the first semiconductor portions 180 and first dielectric material portions 190 as well as the plane of the top surfaces (now located at the bottommost portion of the second substrate 200 after flipping upside down) of the second metal portions 270 and the second dielectric material portions 290. Subsequently, the same processing steps can be employed to form metal semiconductor alloy portions 300 as in the first embodiment. During formation of a metal semiconductor alloy, the semiconductor material in the first semiconductor portions reacts with metallic materials of the first metal portions 170 and the second metal portions 270. Optionally, at least two through-substrate via structures 310 and at least one metal line 320 can be formed as in the first embodiment.

Embodiments in which the first metal-containing material portions (170, 180) or the second metal portions 270 are formed by methods of the second embodiment or methods derived from the second embodiment (for example, by omission of formation of a second metal layer) can also be employed.

Figure 11:
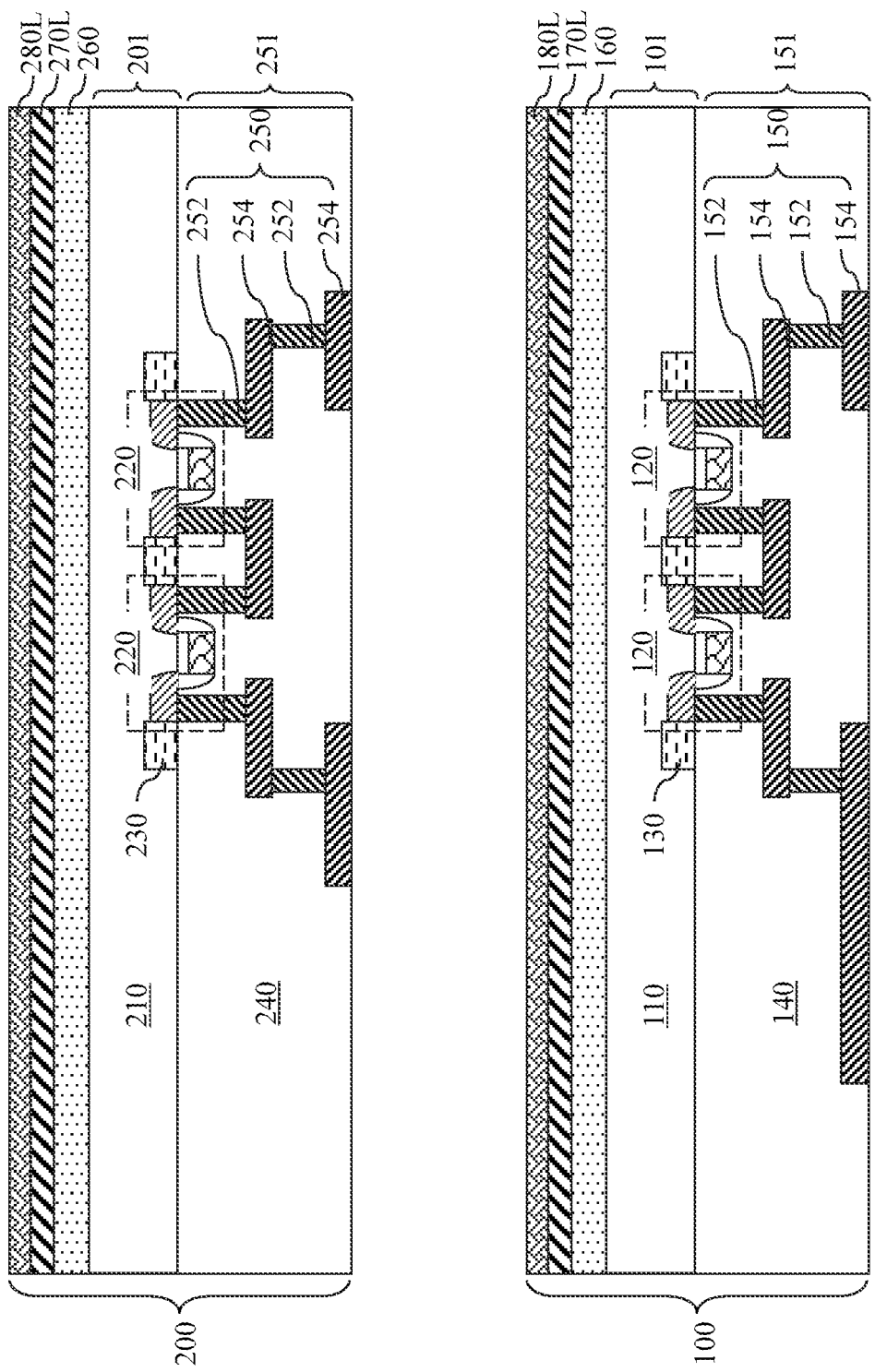
FIGS. 11-13 are sequential vertical cross-sectional views of a fourth exemplary structure according to a fourth embodiment of the present invention.

Referring to FIG. 11, a fourth exemplary structure according to a fourth embodiment of the present invention includes a vertical stack of a first planar dielectric layer 160, a first metal layer 170L, and a first semiconductor layer 180L, which is formed on an exposed surface of a first semiconductor substrate 201, i.e., on an opposite side of a first interconnect-level structure 151. The first semiconductor substrate 101 is more proximal to the first semiconductor layer 180L than the first interconnect-level structure 151. Likewise, a vertical stack of a second planar dielectric layer 260, a second metal layer 270L, and a second semiconductor layer 280L is formed on an exposed surface of a second semiconductor substrate 202, i.e., on an opposite side of a second interconnect-level structure 251. The second semiconductor substrate 201 is more proximal to the second semiconductor layer 280L than the second interconnect-level structure 251.

Figure 12:
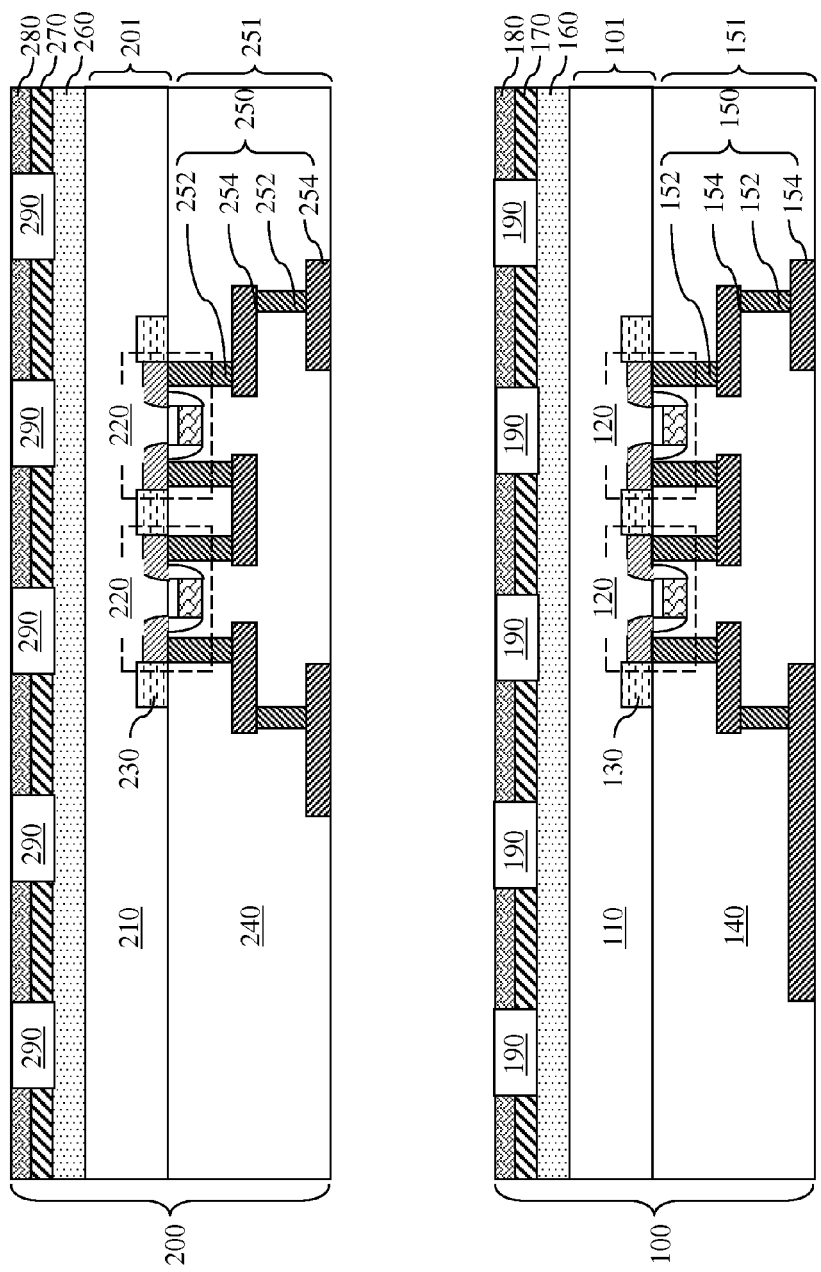

Referring to FIG. 12, first metal-containing material portions and first dielectric material portions 190 are formed in the same manner as in the first embodiment. Each of the first metal-containing material portions is a first material stack of a first metal portion 170 and a first semiconductor portion 180. The first metal-containing material portions (170, 180) and the first dielectric material portions 190 complimentarily fill the entirety of the layer between the top surface of the first planar dielectric layer 160 and the plane of the top surfaces of the first semiconductor portions 180 and the first dielectric material portions 190.

Second metal-containing material portions and second dielectric material portions 290 are formed in the same manner as in the second embodiment. Each of the second metal-containing material portions is a second material stack of a second metal portion 270 and a second semiconductor portion 280. The second metal-containing material portions (270, 280) and the second dielectric material portions 290 complimentarily fill the entirety of the layer between the top surface of the second planar dielectric layer 260 and the plane of the top surfaces of the second semiconductor portions 280 and the second dielectric material portions 290.

Figure 13:
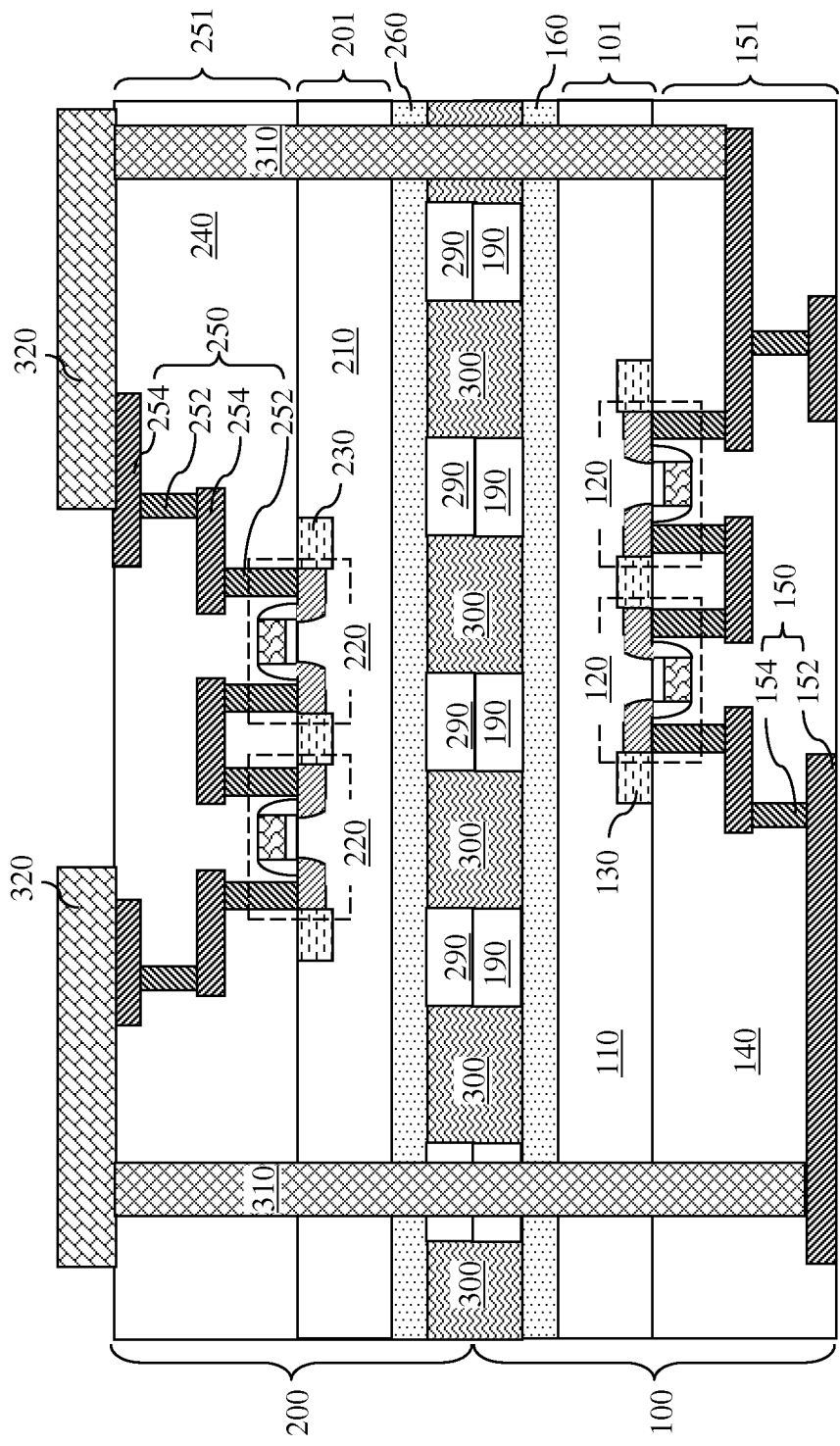

Referring to FIG. 13, the second substrate 200 is flipped upside down. Subsequently, the first substrate 100 and the second substrate 200 are brought into physical contact with each other. Preferably, the first metal-containing material portions (170, 180) and the second metal-containing material portions (270, 280) are brought into contact with each other so that a surface of each second semiconductor portion 280 contacts a surface of one of the first semiconductor portions 180 at an interface plane. Preferably, a surface of each of the first semiconductor portions 180 contacts a surface of one of the second semiconductor portions 280 when the first metal-containing material portions (170, 180) and the second metal-containing material portions (270, 280) are brought into contact with each other. The interface plane is the plane of the top surfaces of the first semiconductor portions 180 and first dielectric material portions 190 as well as the plane of the top surfaces (now located at the bottommost portion of the second substrate 200 after flipping upside down) of the second semiconductor portions 280 and the second dielectric material portions 290.

Subsequently, metal semiconductor alloy portions 300 are formed across the interface plane by conversion of materials of the first metal-containing material portions (170, 180) and the second metal-containing material portions (270, 280) into a metal semiconductor alloy employing the same methods as in the first embodiment. A bonded structure including a vertical stack of the first substrate 100 and the second substrate 200 is thereby formed. The metal semiconductor alloy portions 300 provides adhesive force to the first substrate 100 and the second substrate 200, thereby providing bonding between the first and second substrates (100, 200). Further, the contact between the first and second dielectric material portions (190, 290) can induce diffusion of materials across the interface plane to provide additional adhesive force in some cases.

The first semiconductor substrate 101 is more proximal to the interface plane than the first interconnect-level structure 151, and the second semiconductor substrate 201 is more proximal to the interface than the second interconnect-level structure 251. Optionally, at least two through-substrate via structures 310 that extend through the second substrate 200 is formed as in the first embodiment At least one metal line 320 can be formed on the outer surface of the second substrate 200, i.e., the exposed surface of the second semiconductor substrate 201, as in the first embodiment. The at least one metal line 320 can directly contact portions of the second conductive wiring structures 250. A through-substrate via structure 310 can contact one of the at least one metal line and one of the first conductive wiring structures 150. The through-substrate via structure 310 can pass through a stack of a first dielectric material portion 190 and a second dielectric material portion 290, or through a metal semiconductor alloy portion 300.

Embodiments in which the first metal-containing material portions (170, 180) or the second metal portions 270 are formed by methods of the second embodiment, methods of the third embodiment, or a combination thereof, can also be employed. Further, embodiments in which substrates are bonded front-to-back can also be employed. In one case, the first semiconductor substrate 101 is more proximal to the interface plane than the first interconnect-level structure 151, and the second interconnect-level structure 251 is more proximal to the interface than the second semiconductor substrate 201. Alternately, the first interconnect-level structure 151 is more proximal to the interface plane than the first semiconductor substrate 101, and the second interconnect-level structure 251 is more proximal to the interface than the second semiconductor substrate 201.

Figure 14:
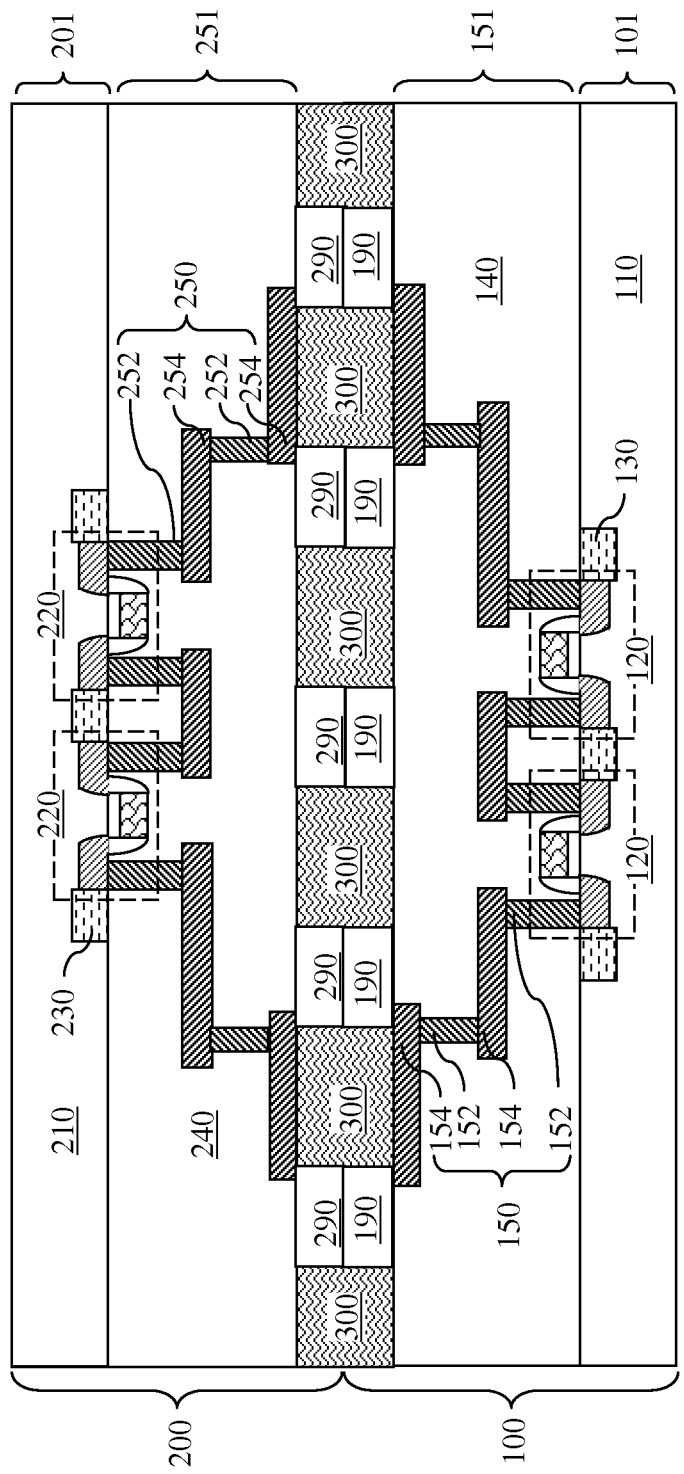
FIG. 14 is a vertical cross-sectional view of a fifth exemplary structure according to a fifth embodiment of the present invention.

Referring to FIG. 14, a fifth exemplary structure according to a fifth embodiment of the present invention can be derived from any structure of the present invention by employing at least one of the metal semiconductor alloy portions 300 as a part of an electrically conductive path between the first substrate 100 and the second substrate 200. At least one of the first conductive wiring structures 150 and the second conductive wiring structures 250 can contacts at least one of the metal semiconductor alloy portions 300. In some cases, the first conductive wiring structures 150 and the second conductive wiring structures 250 can contacts at least one of the metal semiconductor alloy portions 300.

Optionally, one of the at least two through-substrate via structures 310 can contact one of the metal semiconductor alloy portions 300 to provide electrically conductive path therebetween.

Figure 15:
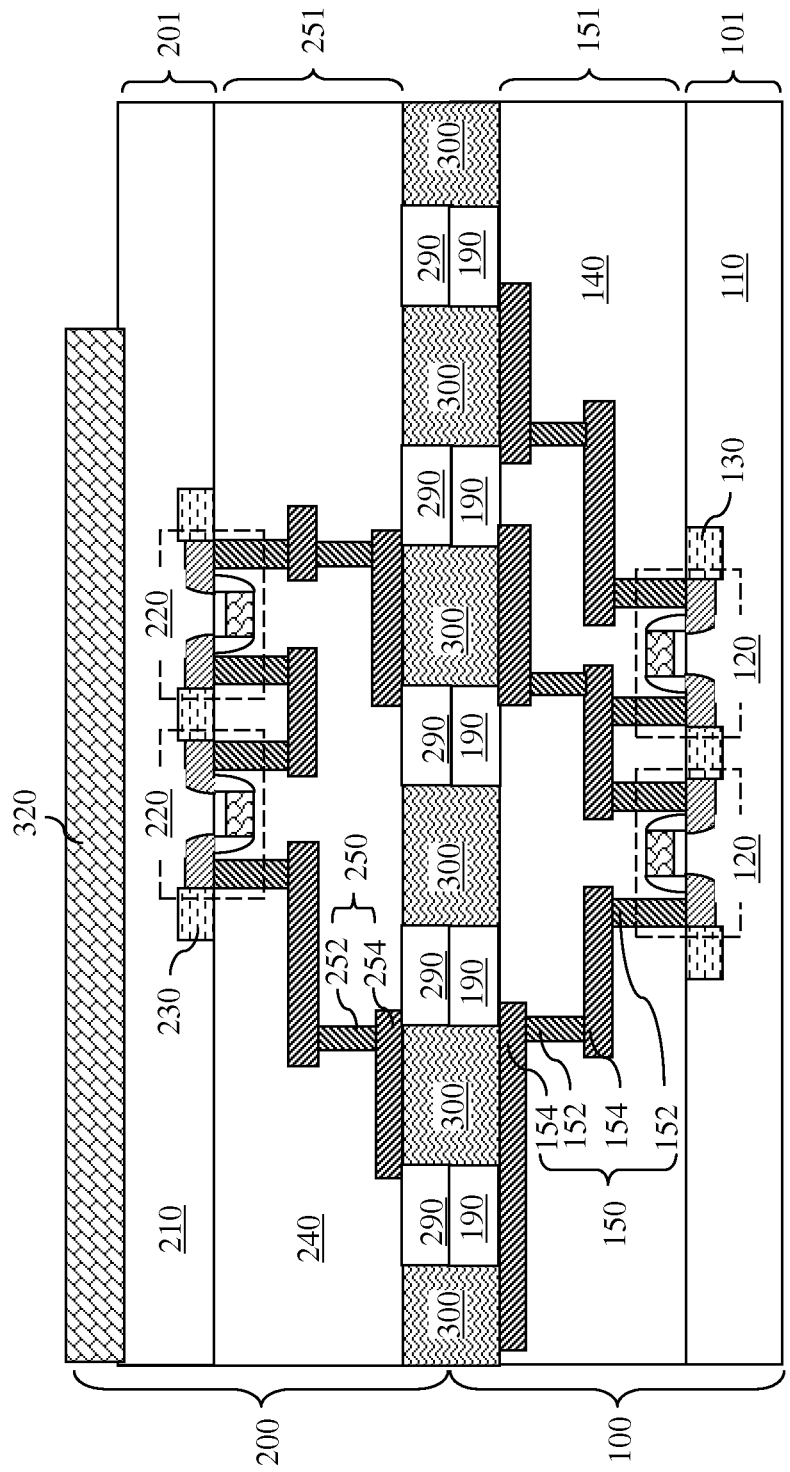
FIG. 15 is a vertical cross-sectional view of a sixth exemplary structure according to a sixth embodiment of the present invention.

Referring to FIG. 15, a sixth exemplary structure according to a sixth embodiment of the present invention can be derived from any structure of the present invention by employing at least one through-substrate via structures 310 as a part of an electrically conductive path. A through-substrate via structures 310 can contact one of the metal semiconductor alloy portions 300 to be employed as a part of an electrically conductive path.

Figure 16:
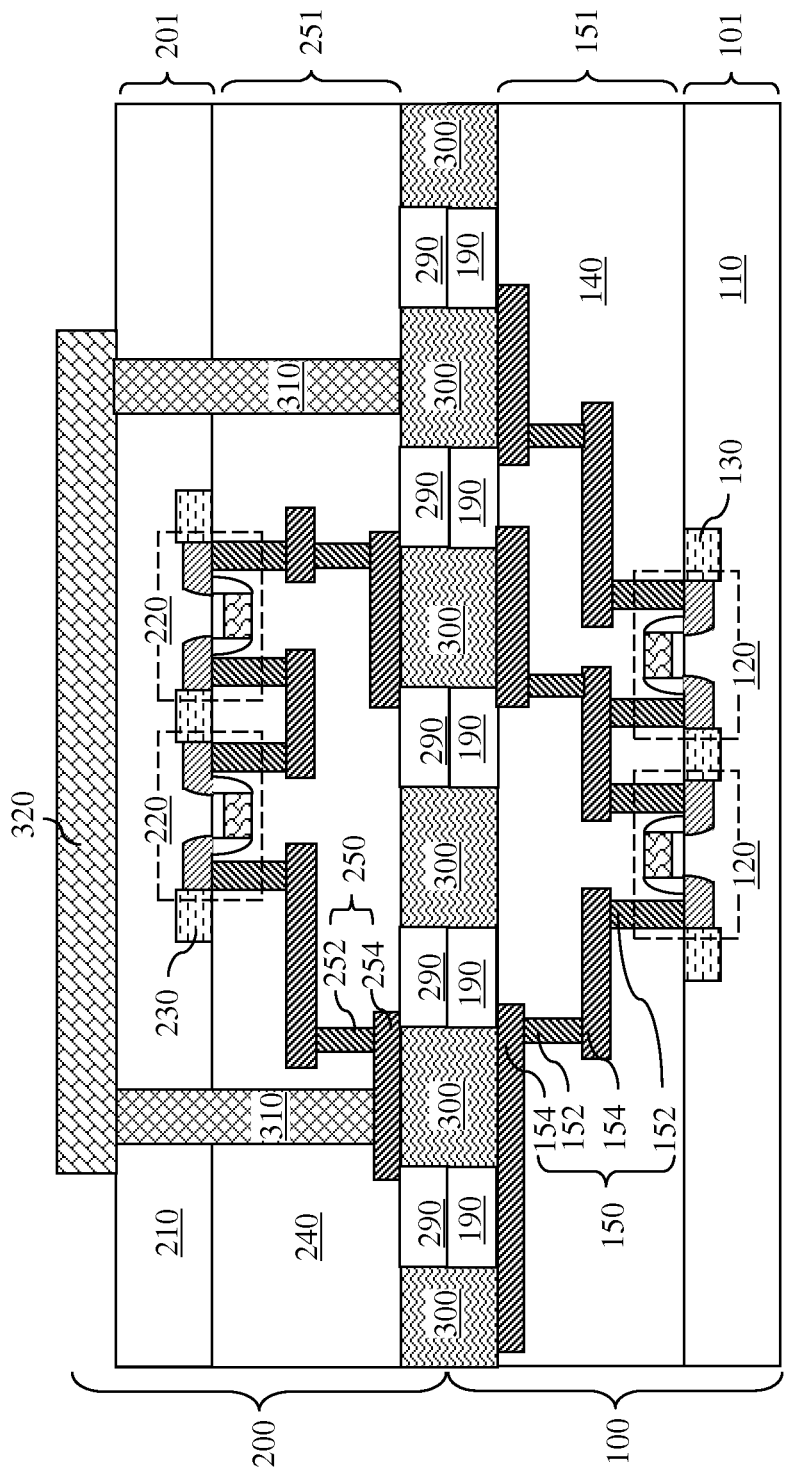
FIG. 16 is a vertical cross-sectional view of a seventh exemplary structure according to a seventh embodiment of the present invention.

Referring to FIG. 16, a seventh exemplary structure according to a seventh embodiment of the present invention can be derived from any structure of the present invention by employing a through-substrate via structure 310 that contacts one of the second conductive wiring structures and another through-substrate via structure 310 that contacts one of the metal semiconductor alloy portions 300.

Figure 17:
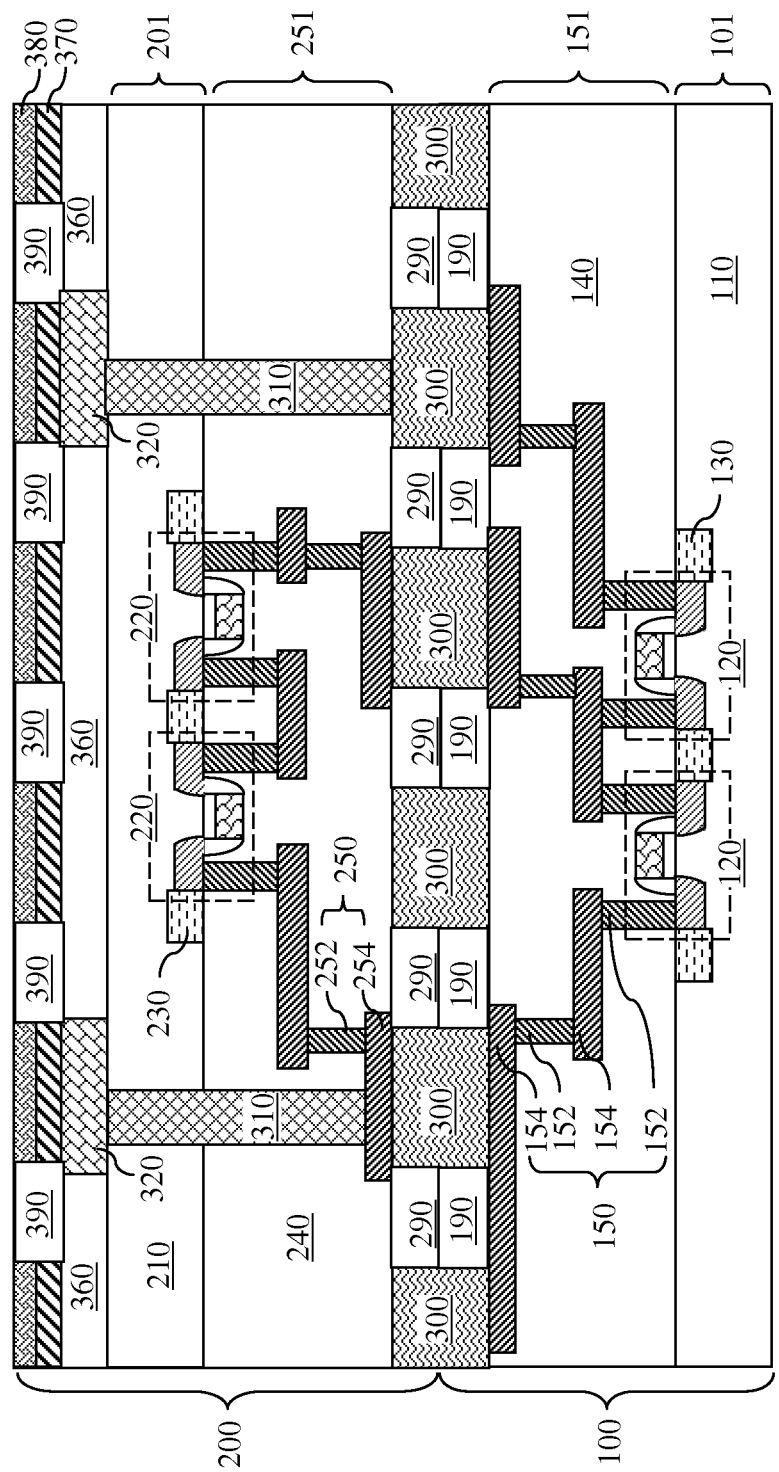
FIGS. 17-19 are sequential vertical cross-sectional views of an eighth exemplary structure according to an eighth embodiment of the present invention.

Referring to FIG. 17, an eighth exemplary structure according to an eighth embodiment of the present invention can be derived from any of the first through seventh exemplary structures of the present invention by forming a layer complimentarily filled with third dielectric material portions 390 and third metal-containing material portions. Each of the third metal-containing material portions can be a third material stack of a third metal portion 370 and a third semiconductor portion 380.

Figure 18:
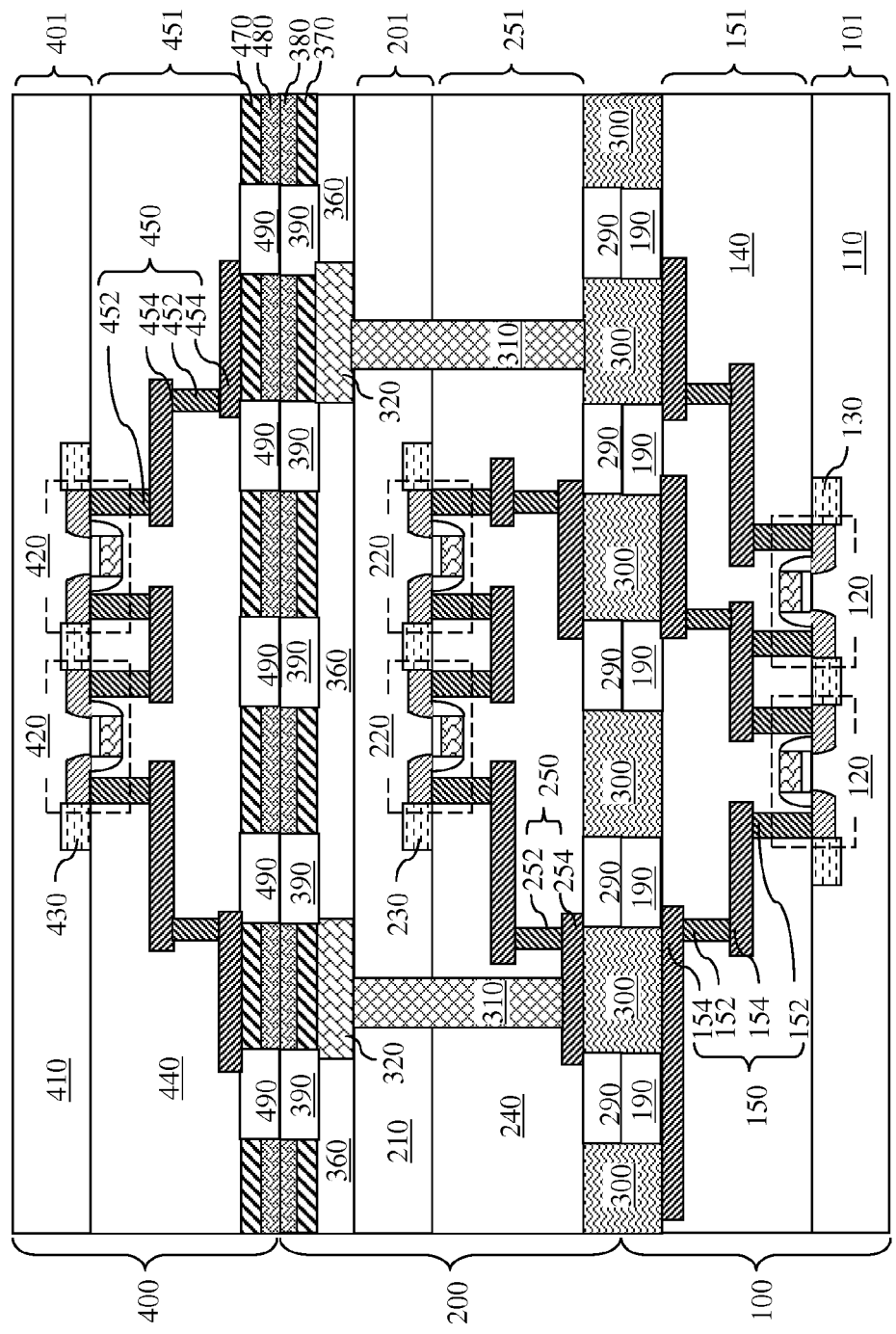
Figure 19:
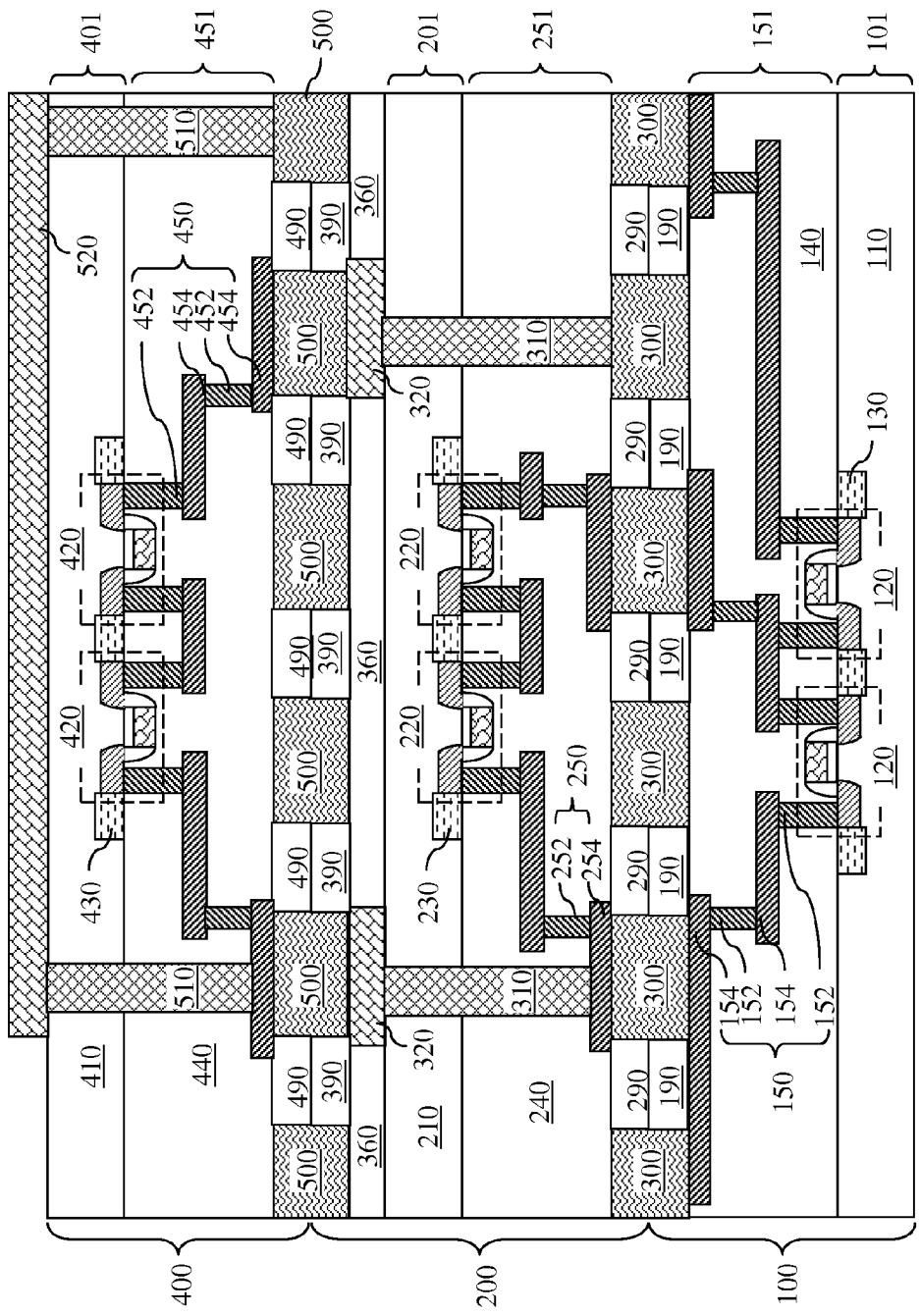

Referring to FIG. 18, a third substrate 400 is provided, which can include a third semiconductor substrate 401 and a third interconnect-level structure 451. The third semiconductor substrate 401 can includes a third semiconductor layer 410. At least one third semiconductor device 420 can be present on the third semiconductor layer 410. The at least one third semiconductor device 420 can be any device that the at least one first semiconductor device 120 or the at least one second semiconductor device 220 can be. The third semiconductor layer 410 includes a semiconductor material, which can be any material that the materials of the first and second semiconductor layers (110, 210) can be.

The third interconnect level structure 451 includes at least one third dielectric material layer 440 and third conductive wiring structures 450 embedded therein. The third conductive wiring structures 450 can include third conductive via structures 452 and third conductive line structures 454. The at least one first dielectric material layer 440 can include any dielectric material that the at least one first dielectric material layer 140 and the at least one second dielectric material layer 240 can include. The third conductive wiring structures 450 embedded in the at least one third dielectric material layer 440 provide electrical connection to the at least one third semiconductor device 420. The at least one third dielectric material layer 440 can include a plurality of dielectric material layers having different compositions.

Fourth metal-containing material portions and fourth dielectric material portions 490 are formed employing any of the methods in the first through third embodiments. Each of the fourth metal-containing material portions can be a fourth material stack of a fourth metal portion 470 and a fourth semiconductor portion 480. Alternately, each of the fourth metal-containing material portions can consist of a fourth metal portion 470. Embodiments are also contemplated in which third metal-containing material portions consist of third metal portions 370 and each of the fourth metal-containing material portions is a fourth material stack of a fourth metal portion 470 and a fourth semiconductor portion 480. The fourth metal-containing material portions and the fourth dielectric material portions 490 complimentarily fill the entirety of a material layer (470, 480, 490).

The third substrate 400 is flipped upside down, and the assembly of the first substrate 100 and the second substrate 200 are brought into physical contact with the third substrate 400. Preferably, the third metal-containing material portions (370, 380) and the fourth metal-containing material portions (470, 480) are brought into contact with each other so that a surface of each fourth semiconductor portion 480 contacts a surface of one of the third semiconductor portions 380 at an interface plane. Preferably, a surface of each of the third semiconductor portions 380 contacts a surface of one of the fourth semiconductor portions 480 when the third metal-containing material portions (370, 380) and the fourth metal-containing material portions (470, 480) are brought into contact with each other.

Subsequently, the same processing steps can be employed to form second metal semiconductor alloy portions 500 as in the first embodiment. During formation of another metal semiconductor alloy, the semiconductor materials in the third and fourth semiconductor portions (380, 480) react with metallic materials of the third and fourth metal portions (370, 470). Optionally, at least two through-substrate via structures 510 and at least one metal line 520 can be formed.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A bonded structure comprising a vertical stack containing, from bottom to top, at least:
   a first semiconductor substrate;
   a first interconnect-level structure;
   a first planar dielectric layer;
   a layer complimentarily filled with metal semiconductor alloy portions and vertical stacks of dielectric material portions, each of said vertical stacks of dielectric material portions including a first dielectric material portion and a second dielectric material portion that contact each other within a same interface plane that is common across all of said vertical stacks;
a second planar dielectric layer;
a second interconnect-level structure; and
a second semiconductor substrate, wherein an entire top surface of one of said metal semiconductor alloy portions is in physical contact with a dielectric surface of said second planar dielectric layer, an entire bottom surface of said one of said metal semiconductor alloy portions is in physical contact with a dielectric surface of said first planar dielectric layer, and entire sidewall surfaces of said one of said metal semiconductor alloy portions are in physical contact with surfaces of said vertical stacks of dielectric material portions.

2. The bonded structure of claim 1, wherein said metal semiconductor alloy portions are comprised of an alloy of at least one metal selected from transition metals, Lanthanides, and Actinides, and at least one semiconductor element selected from Si and Ge.

3. The bonded structure of claim 2, wherein said metal semiconductor alloy portions are comprised of a metal silicide, a metal germanide, or a metal germanosilicide.

4. The bonded structure of claim 3, wherein said at least one metal is nickel or a metallic alloy including at least 30% of nickel in atomic percentage.

5. The bonded structure of claim 1, wherein an entire interface between said first planar dielectric layer and said complementarily filled layer is planar.

6. The bonded structure of claim 5, wherein an entire interface between said second planar dielectric layer and said complementarily filled layer is planar.

7. The bonded structure of claim 1, wherein said first interconnect-level structure comprises first conductive wiring structures and at least one first dielectric material layer, and said second interconnect-level structure comprises second conductive wiring structures and at least one second dielectric material layer.

8. The bonded structure of claim 7, wherein said first interconnect-level structure is more proximal to said same interface plane than said first semiconductor substrate, and said second interconnect-level structure is more proximal to said same interface plane than said second semiconductor substrate.

9. The bonded structure of claim 7, wherein at least one of said first conductive wiring structures and said second conductive wiring structures contacts a top surface or a bottom surface of another of said metal semiconductor alloy portions.

10. The bonded structure of claim 7, further comprising:
at least two through-substrate via structures that extend through said second semiconductor substrate and said second interconnect-level structure; and
at least one metal line contacting said at least two through-substrate via structures.

11. The bonded structure of claim 10, wherein one of said at least two through-substrate via structures contacts one of said second conductive wiring structures.

12. The bonded structure of claim 10, wherein one of said at least two through-substrate via structures contacts one of said metal semiconductor alloy portions.

13. The bonded structure of claim 10, wherein one of said at least two through-substrate via structures contacts one of said first conductive wiring structures.

14. The bonded structure of claim 1, further comprising a third substrate vertically contacting one of said first and second substrates, wherein said second substrate further includes third dielectric material portions and said third substrate includes fourth dielectric material portions, each of said fourth dielectric material portions contacts a surface of one of said third dielectric material portions at a second interface plane between said second and third substrates, said third dielectric material portions and said fourth dielectric material portions laterally contact second metal semiconductor alloy portions, and each of said second metal semiconductor alloy portions extends across said second interface into said second substrate and said third substrate.

15. The bonded structure of claim 1, wherein said metal semiconductor alloy portions include at least one metal semiconductor alloy portion that is not in direct contact with any conductive structure embedded in at least one of said first interconnect-level structure, said first planar dielectric layer, said second planar dielectric layer, and said second interconnect-level structure.

16. The bonded structure of claim 1, wherein each of said metal semiconductor alloy portions is not in direct contact with any conductive structure embedded in at least one of said first interconnect-level structure, said first planar dielectric layer, said second planar dielectric layer, and said second interconnect-level structure.

* * * * *